United States Patent
Yasuda

(10) Patent No.: US 7,002,201 B2
(45) Date of Patent: Feb. 21, 2006

(54) SEMICONDUCTOR DEVICE AND MANUFACTURING METHOD THEREOF

(75) Inventor: Makoto Yasuda, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/274,112

(22) Filed: Oct. 21, 2002

(65) Prior Publication Data
US 2003/0170962 A1    Sep. 11, 2003

(30) Foreign Application Priority Data
Mar. 8, 2002 (JP) .............................. 2002-064239

(51) Int. Cl.
*H01L 29/94* (2006.01)
*H01L 23/053* (2006.01)
*H01L 23/48* (2006.01)

(52) U.S. Cl. ..................... 257/306; 257/700; 257/748; 257/758; 257/764

(58) Field of Classification Search ................ 257/751, 257/748, 758, 767, 761–764, 700, 532, 303, 257/306; 438/637, 687, 643, 239, 250, 653, 438/387, 669, 390, 706, 393, 627, 636
See application file for complete search history.

(56) References Cited

U.S. PATENT DOCUMENTS 6,303,958 B1 * 10/2001 Kanaya et al. .............. 257/310
6,313,003 B1 * 11/2001 Chen
6,344,964 B1 * 2/2002 Adler
6,492,226 B1 * 12/2002 Hsue et al.
6,498,364 B1 * 12/2002 Downey et al.
6,603,165 B1 * 8/2003 Yamauchi et al. .......... 257/296
6,894,331 B1    5/2005 Yoshitomi et al.

FOREIGN PATENT DOCUMENTS

CN           1303132 A     7/2001
JP       2001-267320 A     9/2001
JP         2002-9248 A     1/2002

OTHER PUBLICATIONS

Kajita et al., U.S. Appl. No. 10/153,554 filed Apr. 22, 2002.*
Patent Abstracts of Japan Publication No. 2001-203329 dated Jul. 27, 2001.
Patent Abstracts of Japan Publication No. 2001-036010 dated Feb. 9, 2001.

* cited by examiner

*Primary Examiner*—Ha Tran Nguyen
(74) *Attorney, Agent, or Firm*—Westerman, Hattori, Daniels & Adrian, LLP

(57) ABSTRACT

The present invention includes one wiring or a plurality of wirings and an MIM capacitor formed by capacity coupling of a lower electrode which is connected to an upper surface of the wiring(s) and an upper electrode. The lower electrode is comprised of a material preventive of diffusion of a material of the wiring(s), and it embraces the wiring(s).

9 Claims, 41 Drawing Sheets

F I G. 6A
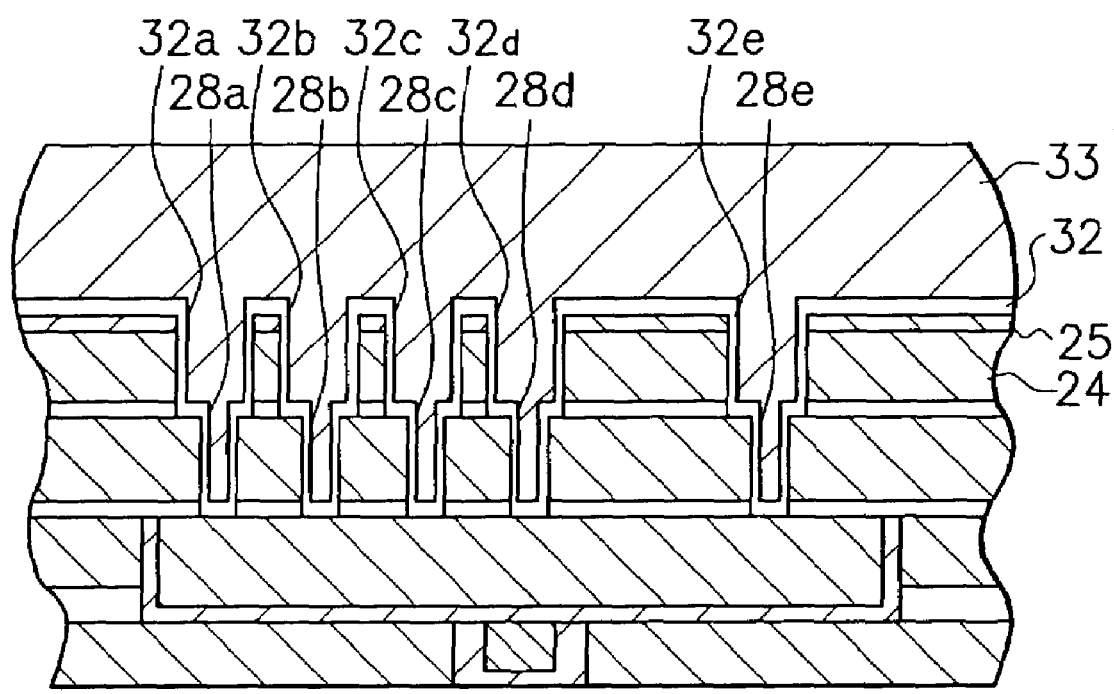
F I G. 6B
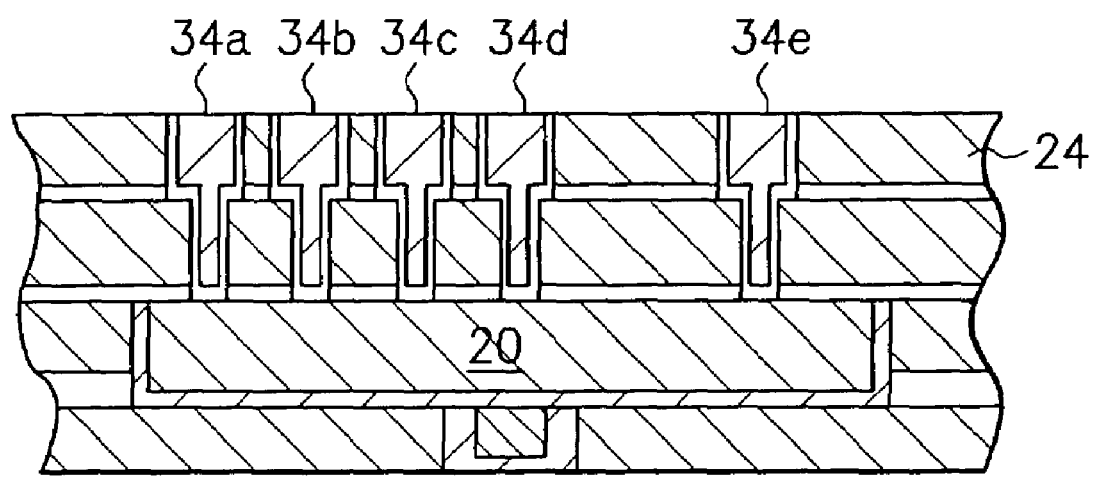

F I G. 9A
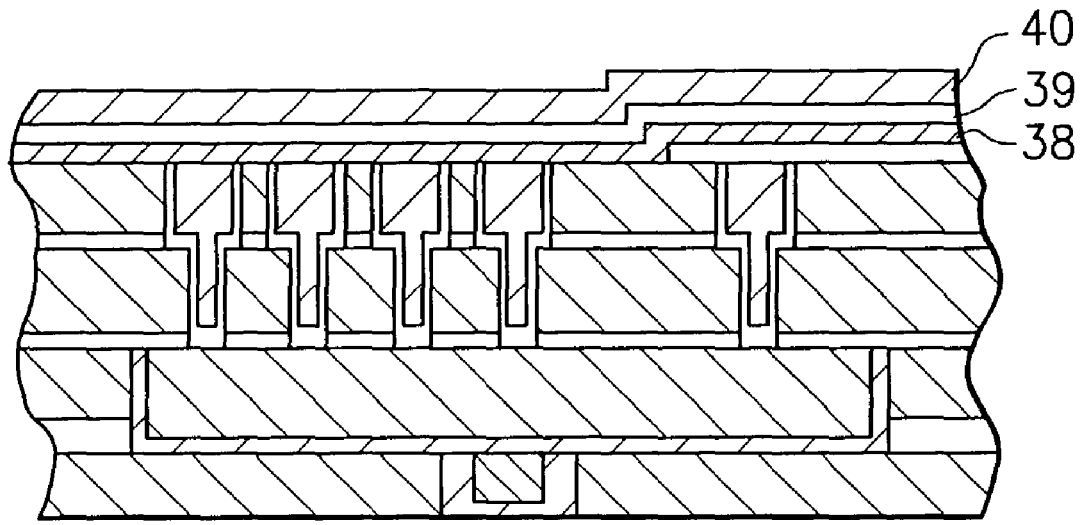
F I G. 9B
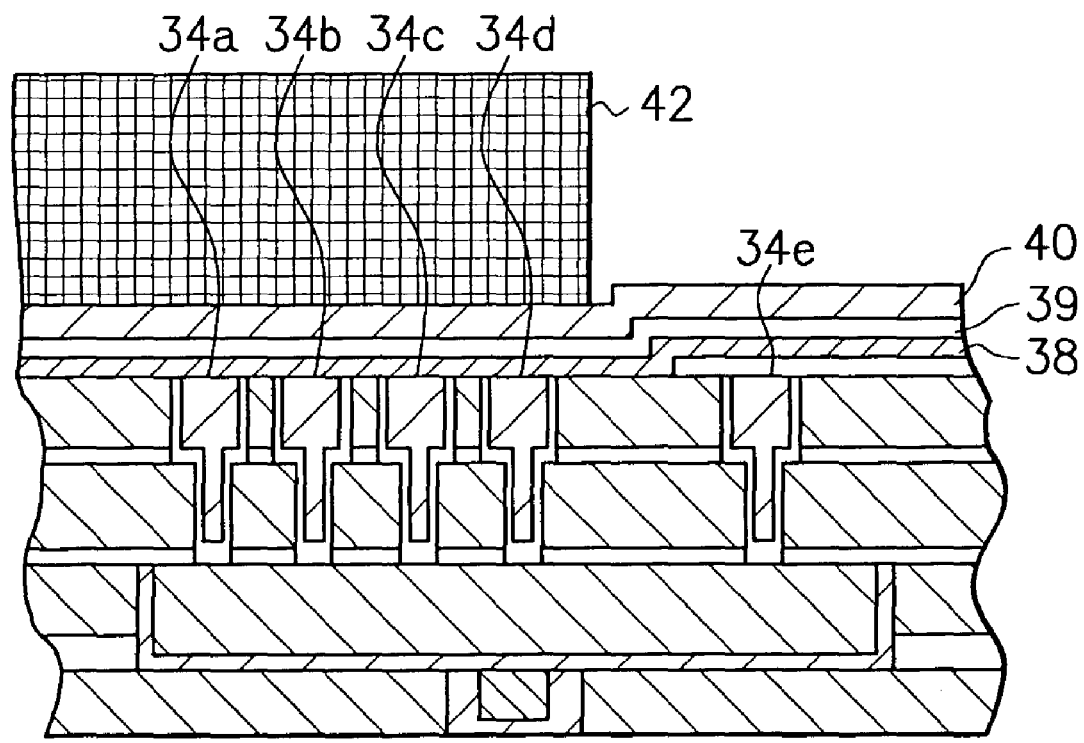

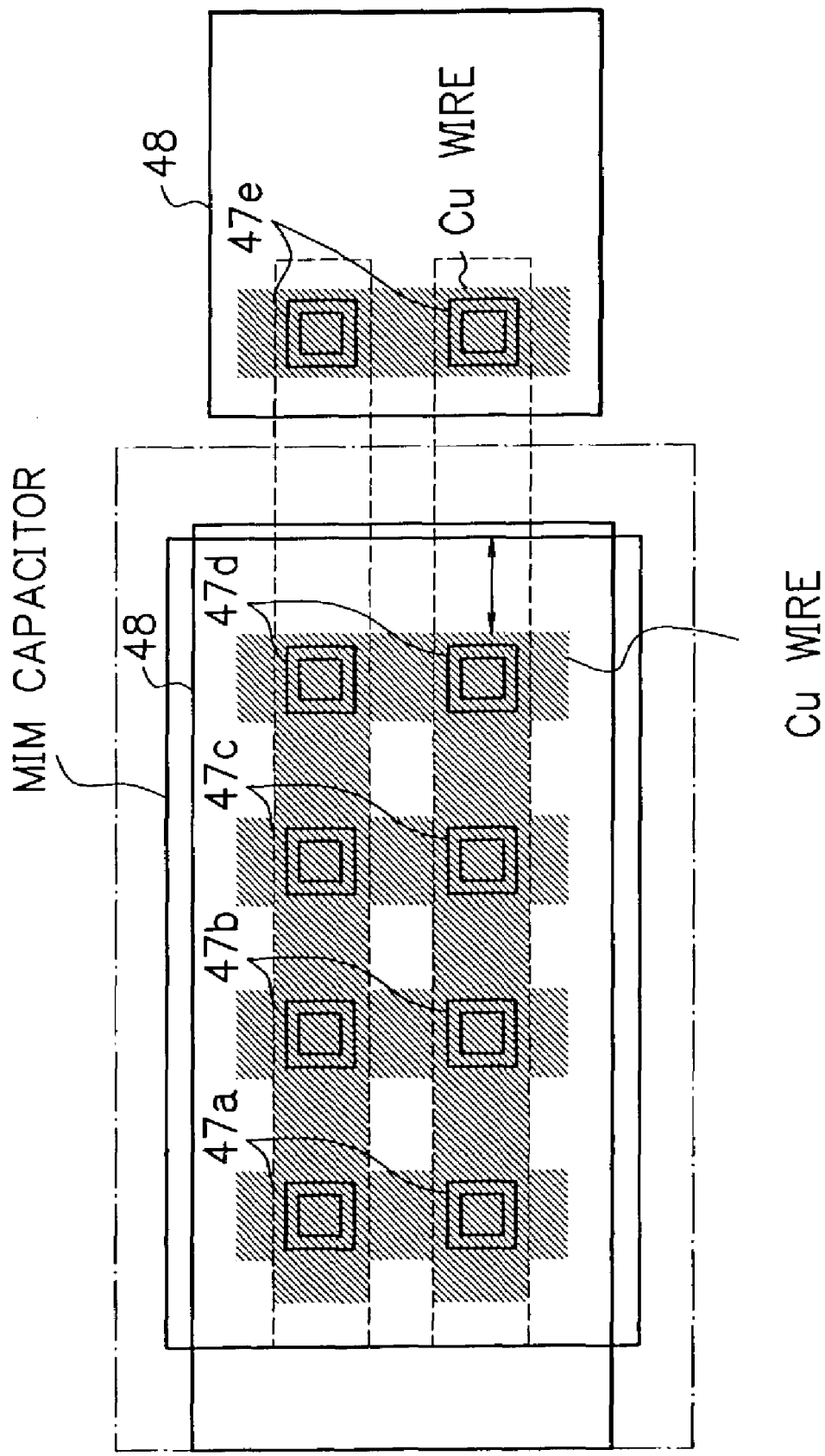

F I G. 18A
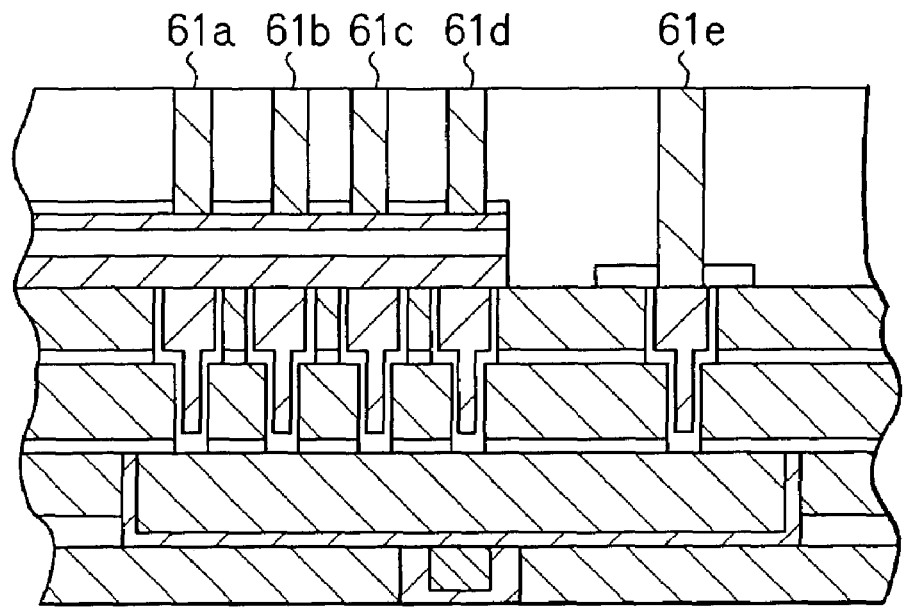
F I G. 18B
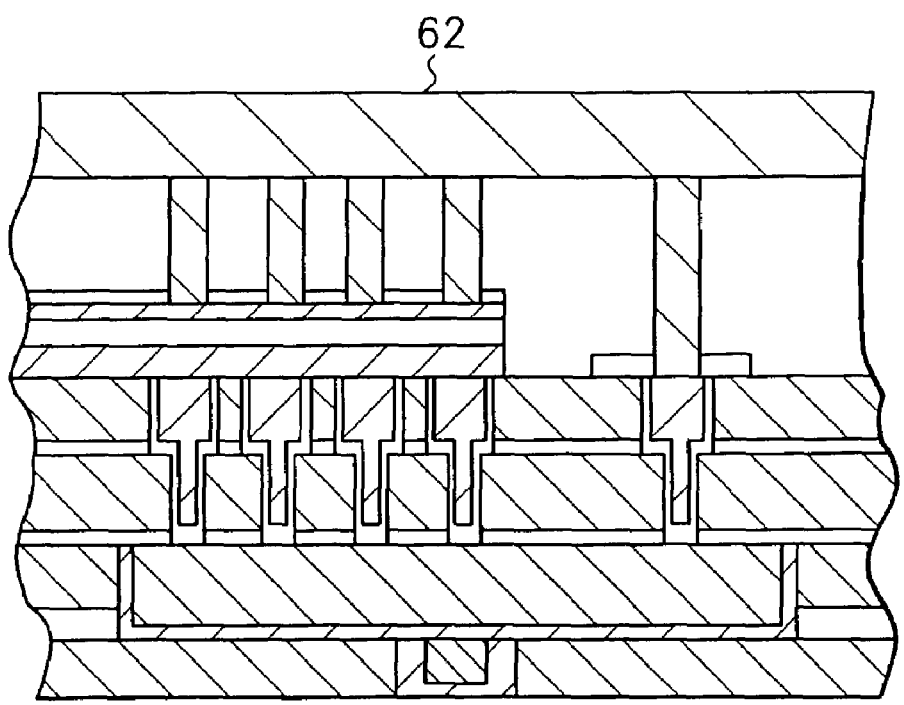

F I G. 21A
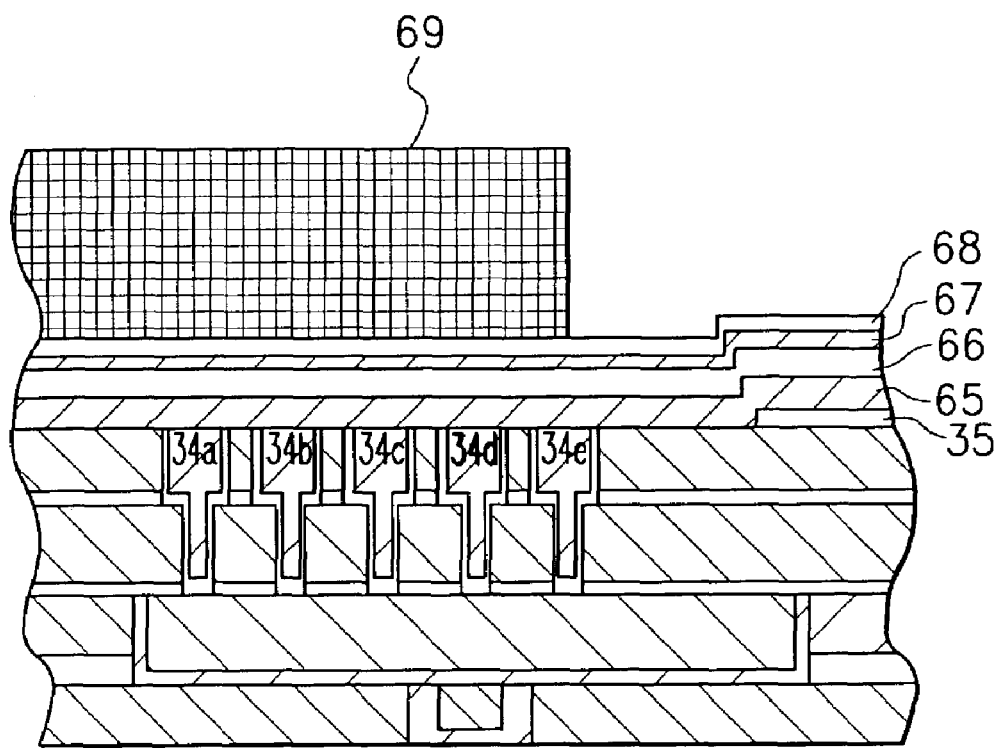
F I G. 21B
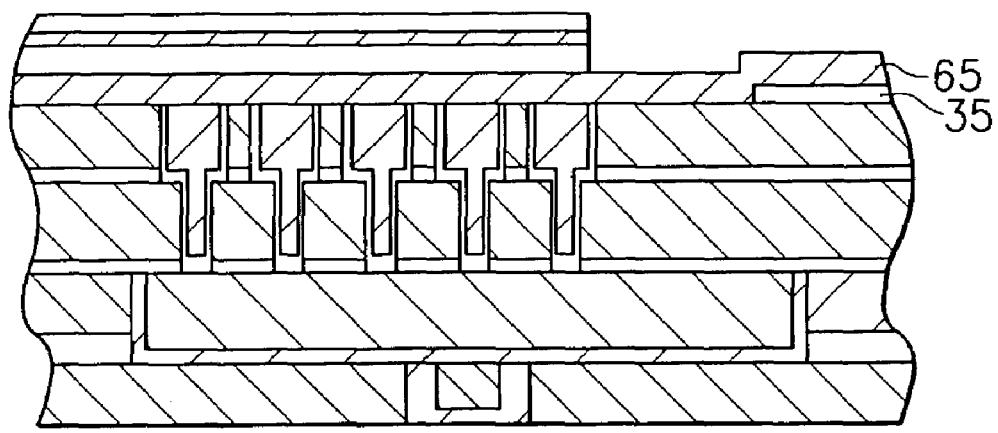

F I G. 32A
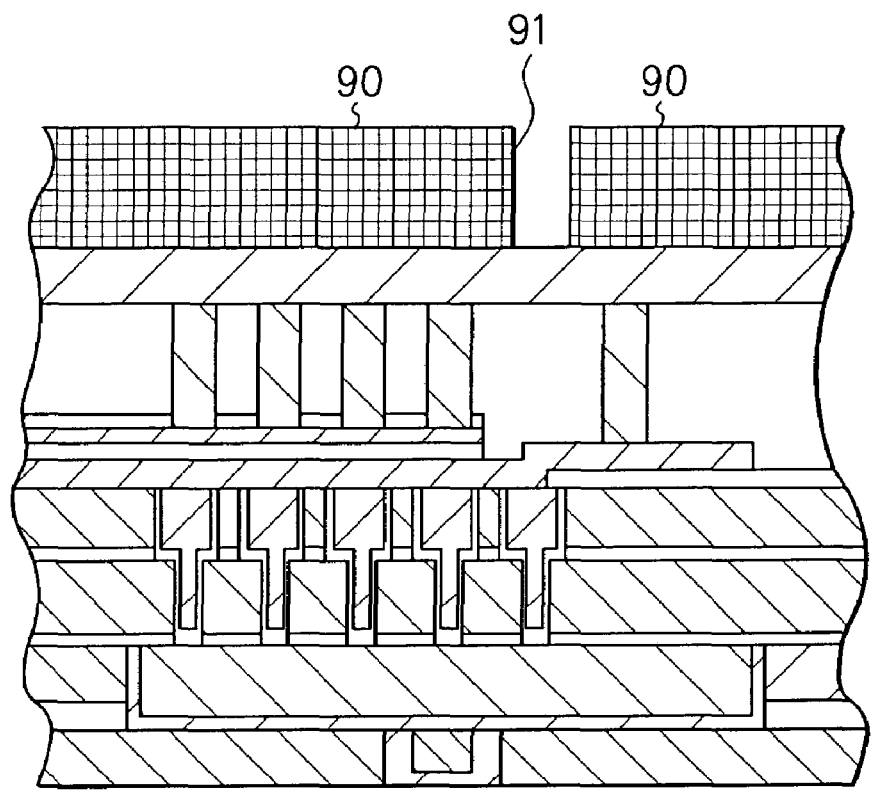
F I G. 32B
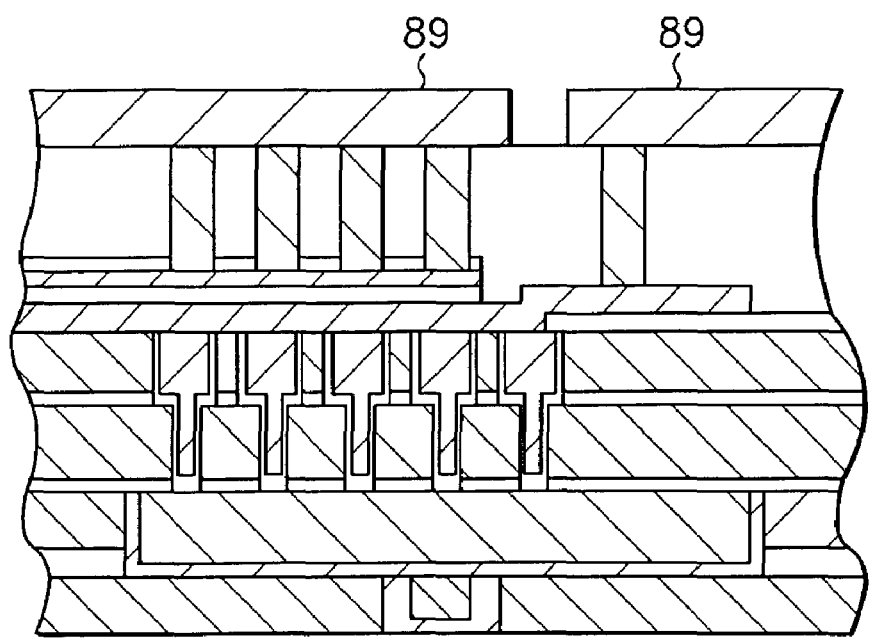

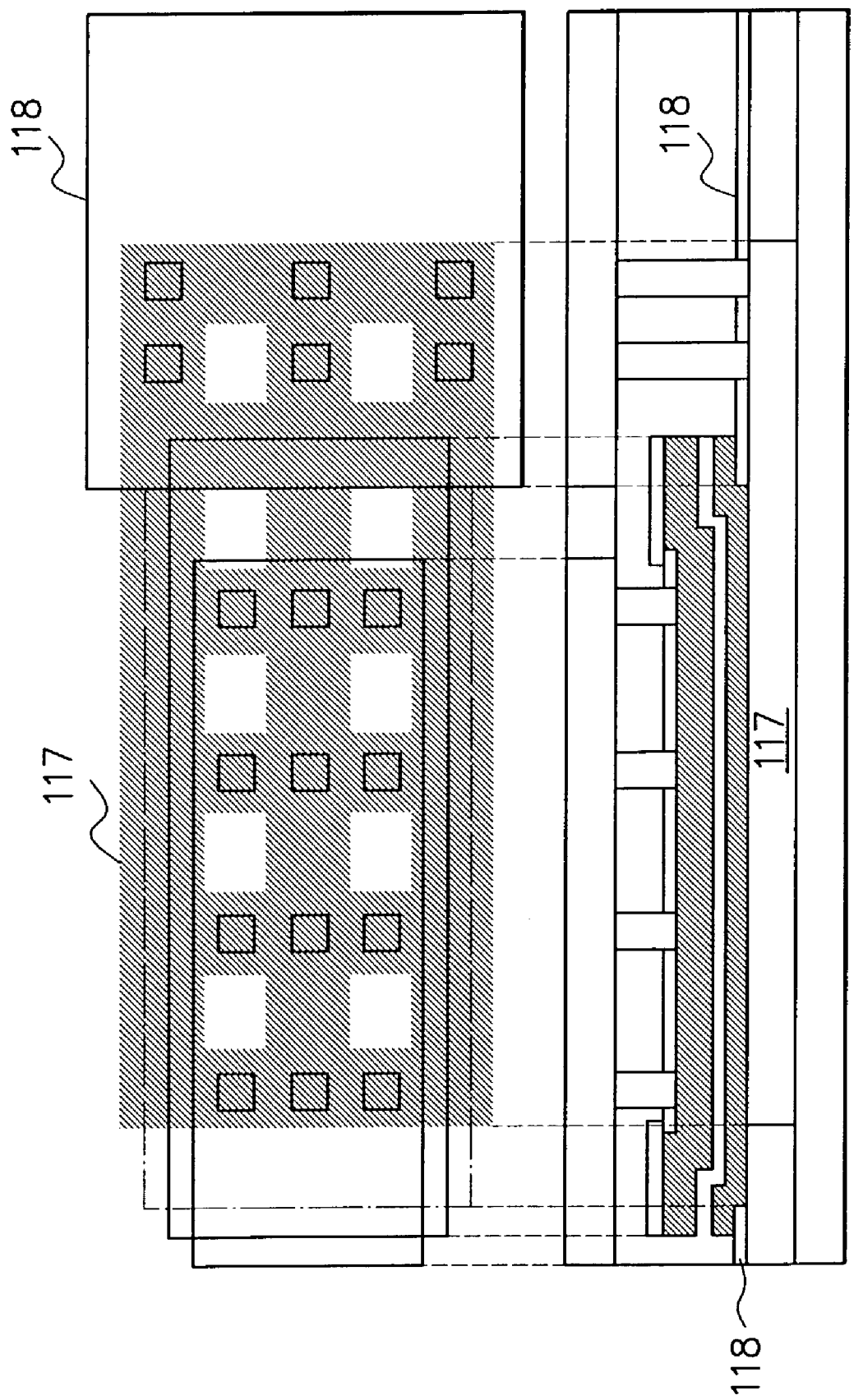

SEMICONDUCTOR DEVICE AND MANUFACTURING METHOD THEREOF

BACKGROUND OF THE INVENTION

1. Field of the Invention

The present invention relates to a semiconductor device and a manufacturing method thereof in which, for example, a multilayered structure inclusive of Cu wirings is applied to an MIM capacitor and, more particularly, to those in which it is taken into consideration to improve a Q value in a high-frequency circuit by lowering a resistance and prevent Cu diffusion from the multilayered structure inclusive of the Cu wirings.

2. Description of the Related Art

Generally, in a high-frequency analog integrated circuit used in a mobile communication field and so on, not only an active element but also a passive element such as a resistance and a capacitor which operate at a high speed are required since it deals with high-frequency signals. In such an integrated circuit, reduction in parasite resistance and parasite capacity is indispensable in order to achieve improvement in operation speed and reduction in power consumption. Especially in a capacitor element, an MIM (Metal-Insulator-Metal) capacitor whose parasite resistance and parasite capacity are remarkably small compared with a conventional MOS-type capacitor has come into general use.

Similarly, the application of a Cu wiring to the integrated circuit has been considered from the viewpoint of the reduction in the parasite resistance and the parasite capacity. It is the most appropriate to use a part of this Cu wiring as an electrode of the aforesaid MIM capacitor, but in ordinary manufacturing processes of the structure inclusive of the Cu wiring, an excessive film is removed by flattening a surface using a CMP method after Cu is embedded in wiring trenches. In order to obtain optimum device performance, it is necessary to minimize polishing of Cu in the wiring trenches and uniformly flatten the surface.

However, barrier metals to prevent Cu diffusion to an oxide film are formed in the wiring trenches, and polishing ratios of a barrier metal layer comprised of a hard material such as TaN and a Cu layer comprised of a soft material greatly differ from each other. Consequently, there is a concern about a problem of so-called dishing that a recessed portion is made on the surface of the Cu layer by a CPM process.

This dishing problem is especially distinguished when the Cu layer with a large surface area such as an electrode section of a capacitor is to be formed. Therefore, it is very difficult to form the electrode section of the MIM capacitor by a Cu film.

SUMMARY OF THE INVENTION

The present invention is made in view of the above problems. It is an object of the present invention to provide a semiconductor device and a manufacturing method thereof which are so configured that a structure inclusive of a Cu wiring is connected to a lower surface of a lower electrode of an MIM capacitor to supply an electrical charge to the lower electrode via a Cu wiring and which can maintain reliability of a function of a wiring capable of preventing Cu diffusion to an oxide film such as an interlayer insulation film.

As a result of assiduous studies, the inventor of the present invention has reached various forms of the inventions described below.

One of the aspects of the present invention is a semiconductor device, comprising: one wiring or a plurality of wirings; and a capacitor formed by capacity coupling of a lower electrode which is connected to an upper surface of the wiring and an upper electrode. The present invention is especially characterized in that the lower electrode is comprised of a material preventive of diffusion of a material of the wiring and embraces the wiring.

Another aspect of the present invention is a semiconductor device manufacturing method, comprising the steps of: forming one wiring or a plurality of wirings; and forming a capacitor by capacity coupling of a lower electrode and an upper electrode. The present invention is especially characterized in that the lower electrode is comprised of a material preventive of diffusion of a material of the wiring and the lower electrode and an upper surface of the wiring are connected in a region where the lower electrode embraces the wiring.

BRIEF DESCRIPTION OF THE DRAWINGS

FIG. 6A and FIG. 6B are diagrammatic sectional views showing the semiconductor device manufacturing method according to the first embodiment in the order of its processes, subsequently to FIG. 5A and FIG. 5B;

FIG. 9A and FIG. 9B are diagrammatic sectional views showing the semiconductor device manufacturing method according to the first embodiment in the order of its processes, subsequently to FIG. 8A and FIG. 8B;

FIG. 14 is a diagrammatic plan view showing the structure of a semiconductor device according to the first embodiment;

FIG. 18A and FIG. 18B are diagrammatic sectional views showing the semiconductor device manufacturing method according to the second embodiment in the order of its processes, subsequently to FIG. 17A and FIG. 17B;

FIG. 21A and FIG. 21B are diagrammatic sectional views showing the semiconductor device manufacturing method according to the third embodiment in the order of its processes, subsequently to FIG. 20A and FIG. 20B;

FIG. 32A and FIG. 32B are diagrammatic sectional views showing the semiconductor device manufacturing method according to the fourth embodiment in the order of its processes, subsequently to FIG. 31A and FIG. 31B;

FIG. 42 is a diagrammatic plan view and a diagrammatic sectional view showing the structure of a semiconductor device according to Comparison 3.

DETAILED DESCRIPTION OF THE PREFERRED EMBODIMENTS

<Basic Gist of Present Invention>

With the aim of lowering the resistance of an MIM capacitor, the inventor of the present invention has thought of a capacitor structure which can lower the resistance to an extent substantially equivalent to that in a case when a lower electrode of the MIM capacitor is backed with a low resistance wiring comprised of Cu or the like and the lower electrode is comprised of Cu.

In this case, however, there is a concern about a problem that Cu atoms easily diffuse to an insulator such as a silicon oxide film which is often used for an interlayer insulation film. The inventor of the present invention has devised a material used for the lower electrode and the backing structure of a Cu wiring to prevent the exposure of Cu to the insulator, thereby maintaining a function of the wiring. Specifically, the following backing structure has been thought of. Namely, a conductive film, such as titanium nitride (TiN), having a Cu diffusion preventive function is used for the lower electrode and the lower electrode embraces the surface of the Cu wiring. This structure enables the connection of the Cu wiring and the lower electrode while eliminating a portion of Cu exposed to the insulator.

Note that 'embrace' mentioned here means that a part of a surface region of the lower electrode embraces the surface of the wiring or embraces a plane region above the wiring. The embracement of the Cu wiring by the lower electrode prevents the Cu diffusion so that reliability of the function of the wiring can be maintained. Furthermore, owing to the aforesaid decrease in resistance, a great improvement in a Q value can be expected especially when the present invention is applied to a high-frequency circuit.

The explanation to follow details embodiments of the present invention with reference to the attached drawings.

<First Embodiment>

A first embodiment of the present invention will be explained first. FIG. 1 to FIG. 13A and FIG. 13B are diagrammatic sectional views showing a semiconductor device manufacturing method according to the first embodiment in the order of its processes.

-Formation of MOS Transistor Structure-

First, a MOS transistor structure is formed on a semiconductor substrate.

Figure 1:
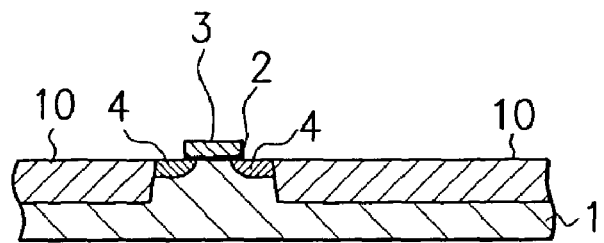
FIG. 1 is a diagrammatic sectional view showing a semiconductor device manufacturing method according to a first embodiment of the present invention in the order of its processes.

Specifically, as shown in FIG. 1, element separation is made on a silicon semiconductor substrate 1 by a LOCOS method or an STI method. Here, an element separation film 10 is formed to demarcate an element active region, the element separation film 10 being comprised of an insulator which is filled in trenches formed in the semiconductor substrate 1.

Next, after a thin gate insulation film 2 comprised of $SiO_2$ or SiON is formed on the semiconductor substrate 1, a polycrystalline silicon film is formed on it. Then, the polycrystalline silicon film and the gate insulation film 2 are patterned to form a gate electrode 3 on the semiconductor substrate 1 via the gate insulation film 2. Then, with the gate electrode 3 used as a mask, impurities are ion-implanted onto a surface layer of the semiconductor substrate 1 at both ends of the gate electrode 3 to form a source/drain 4. Thereby, the MOS transistor structure is formed.

-Formation of Structure Inclusive of Cu Wirings-

Subsequently, a multilayered structure inclusive of Cu wirings is formed. This multilayered structure inclusive of the Cu wirings is connected to the surface of the source/drain 4 of the MOS transistor structure via a plug as shown, for example, in FIG. 1.

Note that the MOS transistor structure is omitted in FIG. 2A to FIG. 13B which will be hereinafter explained, for the convenience of explanation.

Figure 2A:
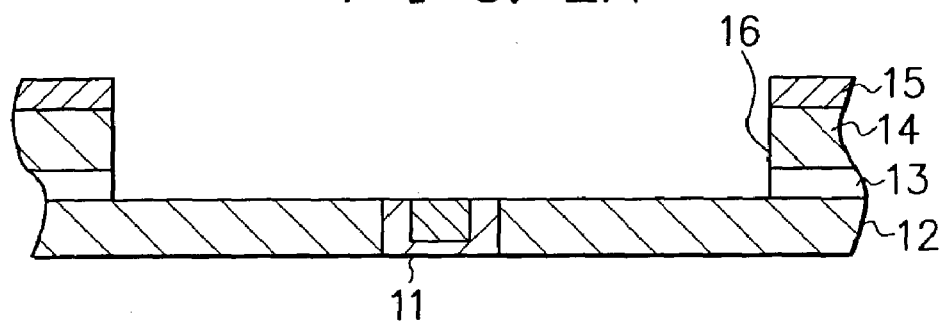
FIG. 2A, FIG. 2B, and FIG. 2C are diagrammatic sectional views showing the semiconductor device manufacturing method according to the first embodiment in the order of its processes, subsequently to FIG. 1.

First, as shown in FIG. 2A, a silicon nitride film 13, an FSG (fluoro-silicate glass) film 14, and an anti-reflection film 15 are formed in sequence on an interlayer insulation film 12 having a tungsten (W) plug 11 formed in a part thereof, and a first wiring trench 16 which is an opening above the W plug 11 is formed by photolithography.

Figure 2B:
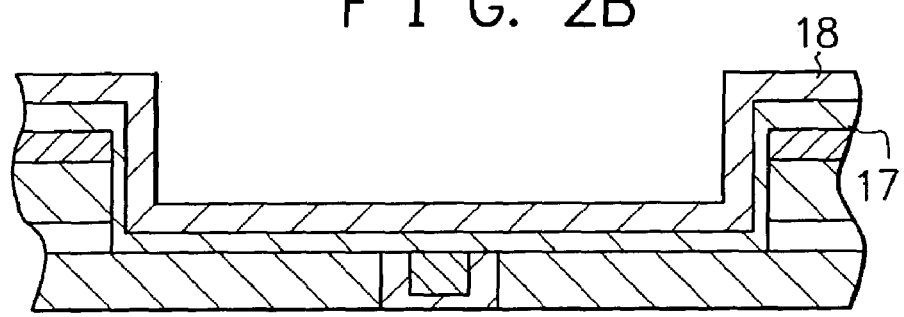
Figure 2C:
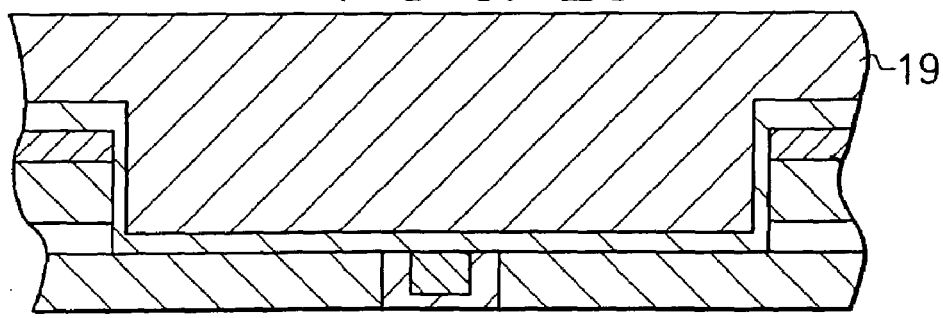

Subsequently, as shown in FIG. 2B, a barrier metal film 17 comprised of tantalum nitride (TaN) and a Cu film 18 as a seed metal film are successively formed in vacuum in sequence by a sputtering unit. Next, as shown in FIG. 2C, with the barrier metal film 17 used as an electrode, a Cu film 19 is formed to fill the first wiring trench 16 by a plating method.

Figure 3A:
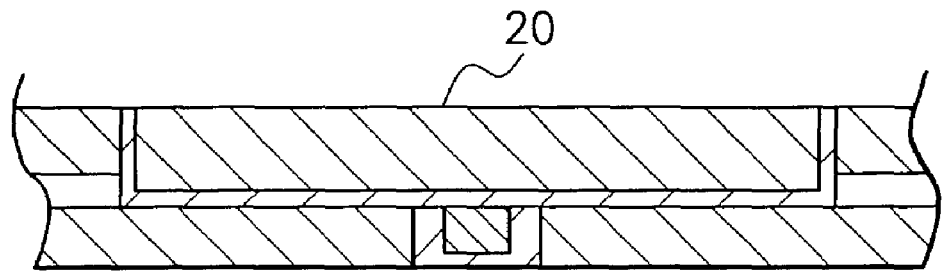
FIG. 3A, FIG. 3B, and FIG. 3C are diagrammatic sectional views showing the semiconductor device manufacturing method according to the first embodiment in the order of its processes, subsequently to FIG. 2A, FIG. 2B, and FIG. 2C.

Subsequently, as shown in FIG. 3A, the Cu film 19 is polished by a CMP method until the surface of the FSG film 14 is exposed to form a first Cu wiring 20 in the first wiring trench 16.

Figure 3B:
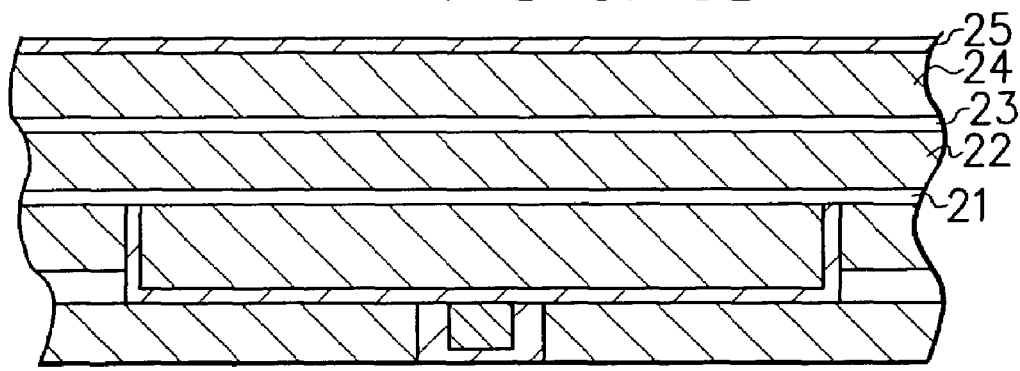

Subsequently, as shown in FIG. 3B, a silicon nitride film 21 which serves as a diffusion barrier film of the first Cu wiring 20, an interlayer insulation film 22 comprised of oxide silicon, a silicon nitride film 23, an interlayer insulation film 24 comprised of oxide silicon, and an anti-reflection film 25 are formed in sequence.

Figure 3C:
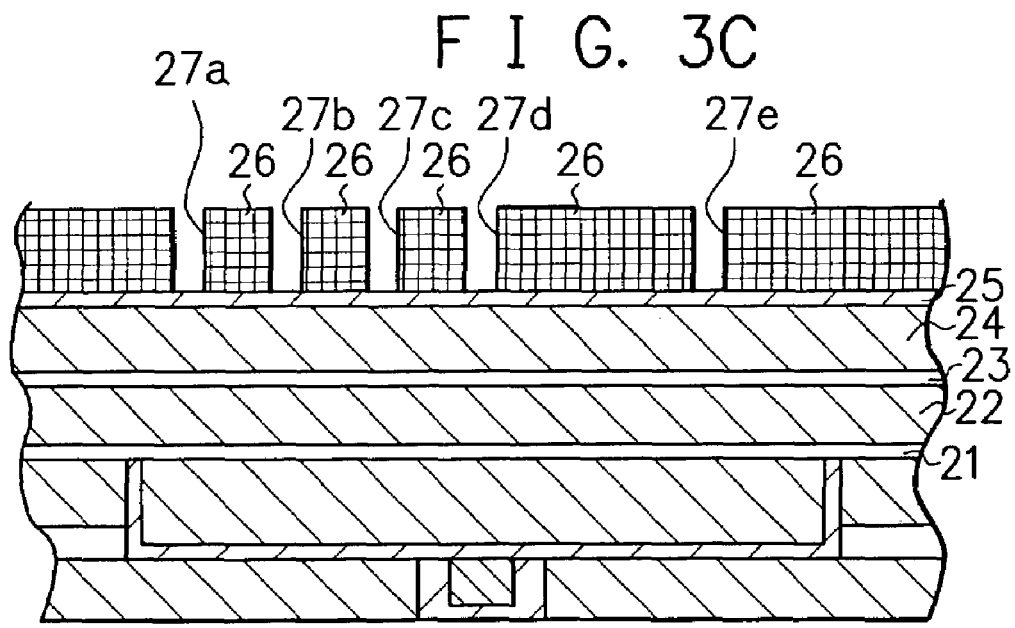

Subsequently, as shown in FIG. 3C, a photo resist 26 is applied and a plurality of aperture patterns 27a to 27e which are openings above the first Cu wiring 20 are formed by photolithography.

Figure 4A:
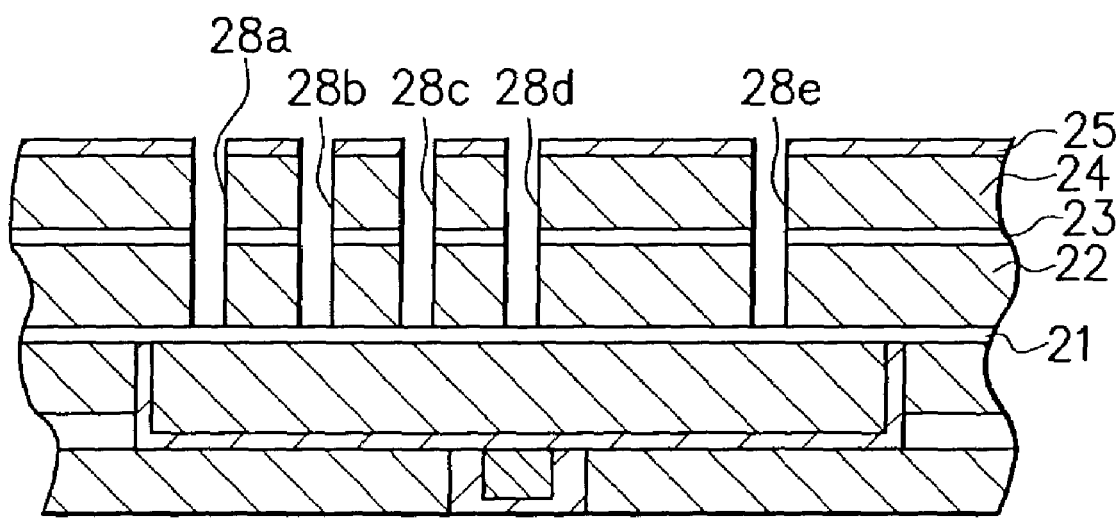
FIG. 4A and FIG. 4B are diagrammatic sectional views showing the semiconductor device manufacturing method according to the first embodiment in the order of its processes, subsequently to FIG. 3A, FIG. 3B, and FIG. 3C.
Figure 4B:
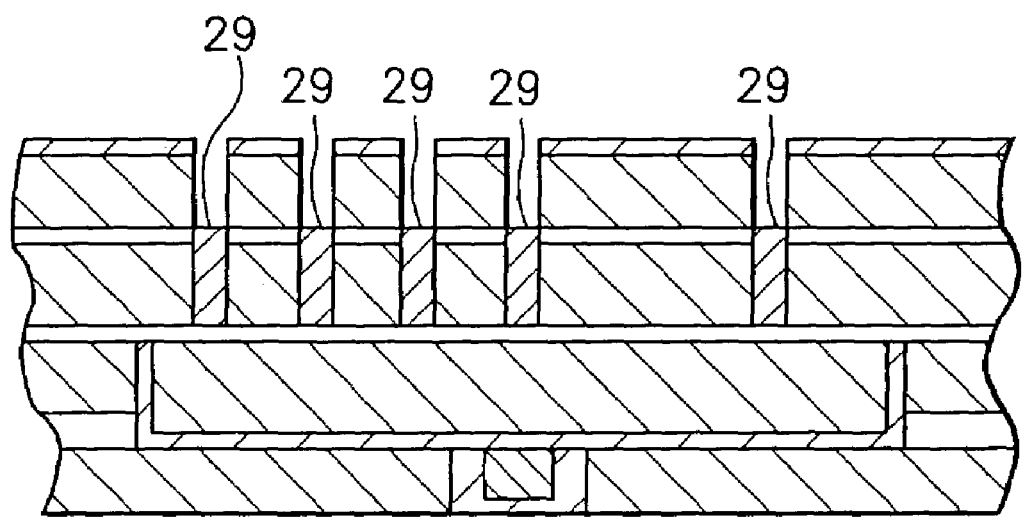

Subsequently, as shown in FIG. 4A, with the photo resist 26 used as a mask and with the silicon nitride film 21 used as an etching stopper, the anti-reflection film 25, the interlayer insulation film 24, the silicon nitride film 23, and the interlayer insulation film 22 are dry-etched to form via holes 28a to 28e in portions corresponding to the aperture patterns 27a to 27e. Then, the photo resist 26 is removed by ashing or the like. Next, as shown in FIG. 4B, a protective material 29 comprised of resist or the like is filled in lower portions of the via holes 28a to 28e.

Figure 5A:
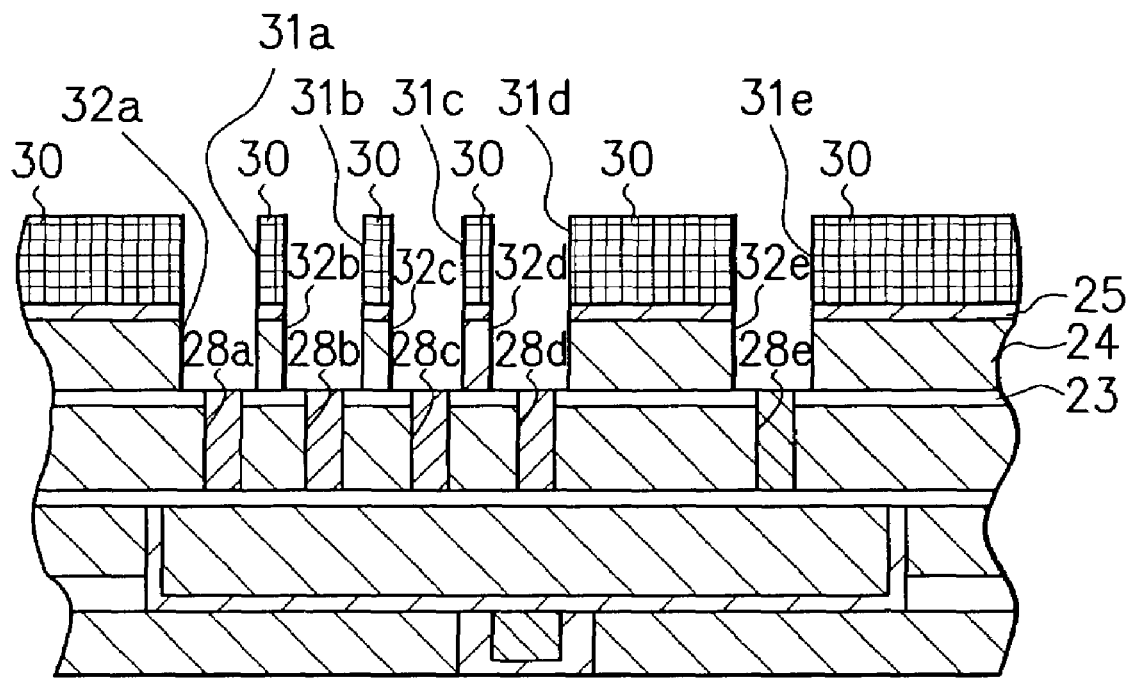
FIG. 5A and FIG. 5B are diagrammatic sectional views showing the semiconductor device manufacturing method according to the first embodiment in the order of its processes, subsequently to FIG. 4A and FIG. 4B.

Subsequently, as shown in FIG. 5A, a photo resist 30 is applied and processed by photolithography to form second wiring trench patterns 31a to 31e which are openings above the via holes 28a to 28e respectively. Then, with the photo resist 30 used as a mask and the silicon nitride film 23 used as an etching stopper, the anti-reflection film 25 and the interlayer insulation film 24 are dry-etched. Thereby, second wiring trenches 32a to 32e are formed in portions corresponding to the second wiring trench patterns 31a to 31e respectively.

Figure 5B:
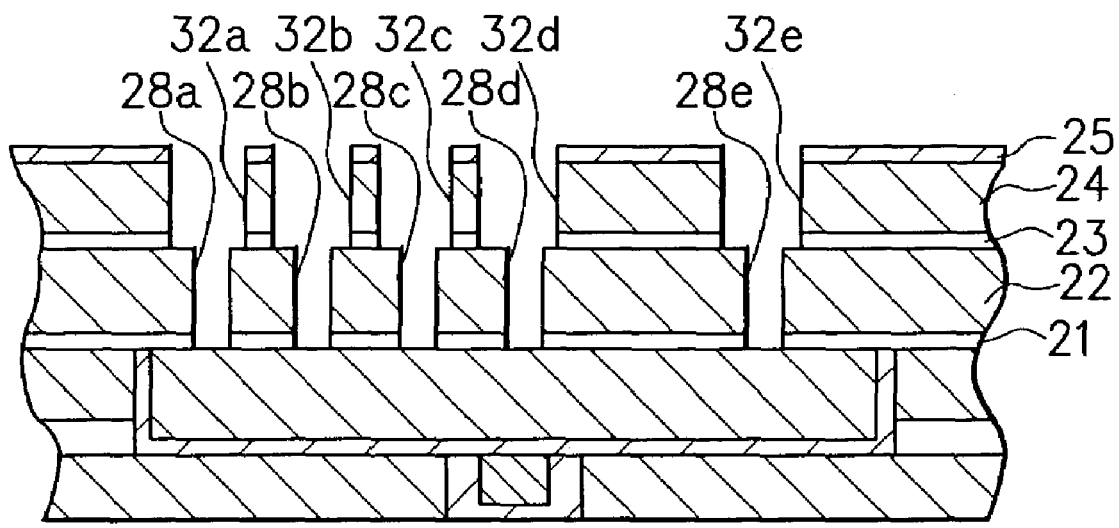

Subsequently, as shown in FIG. 5B, after the photo resist 30 and the protective material 29 are removed by ashing or the like, the residual silicon nitride film 23 in bottom portions of the via holes 28a to 28e and the residual silicon nitride film 21 in bottom portions of the second wiring trenches 32a to 32e are removed by whole-surface dry etching. Thereby, the second wiring trenches 32a to 32e and the via holes 28a to 28e are integrated respectively.

Subsequently, as shown in FIG. 6A, after a barrier metal film 32 comprised of TaN and a Cu film (not shown) as a seed film are successively formed in vacuum in sequence by the sputtering unit, a Cu film 33 is formed in the wiring trenches by a plating method with the barrier metal film 32 used as an electrode.

Subsequently, as shown in FIG. 6B, after the Cu film 33, the barrier metal film 32, and the anti-reflection film 25 are polished by a CMP method so as to leave the Cu film 33 only in the second wiring trenches 32a to 32e and the via holes 28a to 28e until the surface of the interlayer insulation film 24 is exposed, the surface is washed by wetting to form second Cu wirings 34a to 34e. Through the above processes, the multilayered structure inclusive of the Cu wirings constituted of the first Cu wiring 20 and the second Cu wirings 34a to 34e is formed.

-Capacity Formation-

Next, an MIM capacitor is formed on the multilayered structure inclusive of the Cu wirings described above.

Figure 7A:
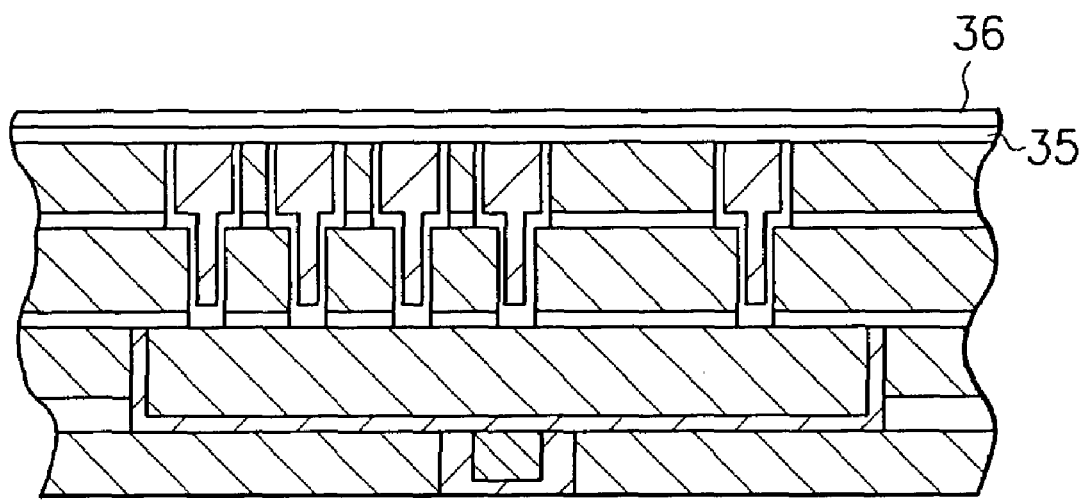
FIG. 7A and FIG. 7B are diagrammatic sectional views showing the semiconductor device manufacturing method according to the first embodiment in the order of its processes, subsequently to FIG. 6A and FIG. 6B.

First, as shown in FIG. 7A, a silicon nitride film 35 having a Cu diffusion preventive function and a silicon oxide film 36 are formed in sequence on the aforesaid multilayered structure inclusive of the Cu wirings to be about 70 nm and about 100 nm in film thickness respectively.

Figure 7B:
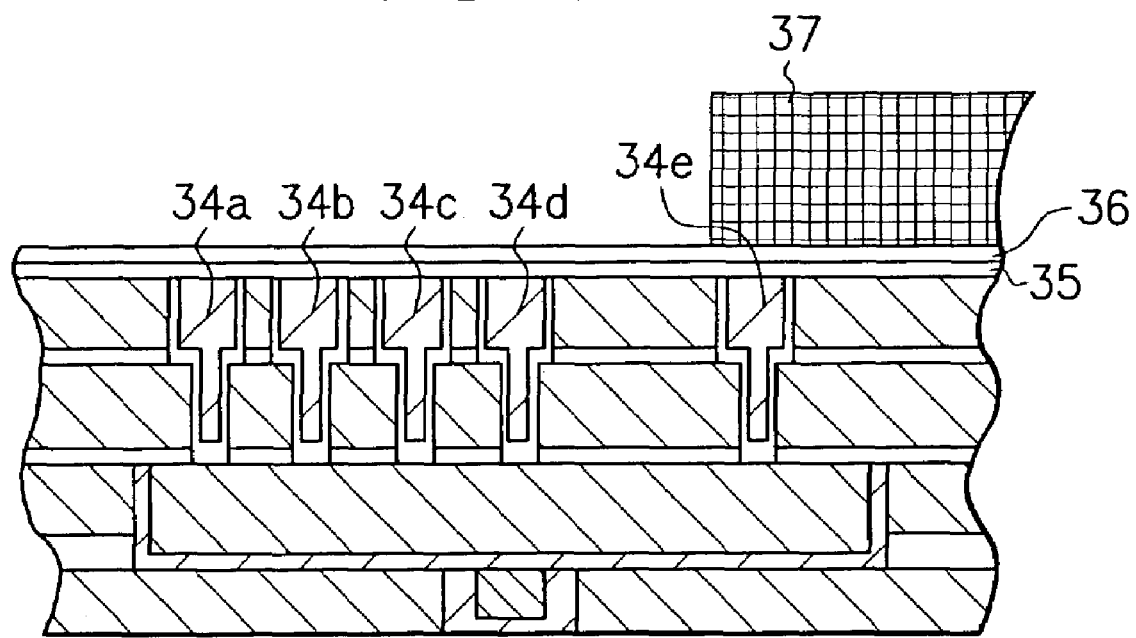
Figure 8A:
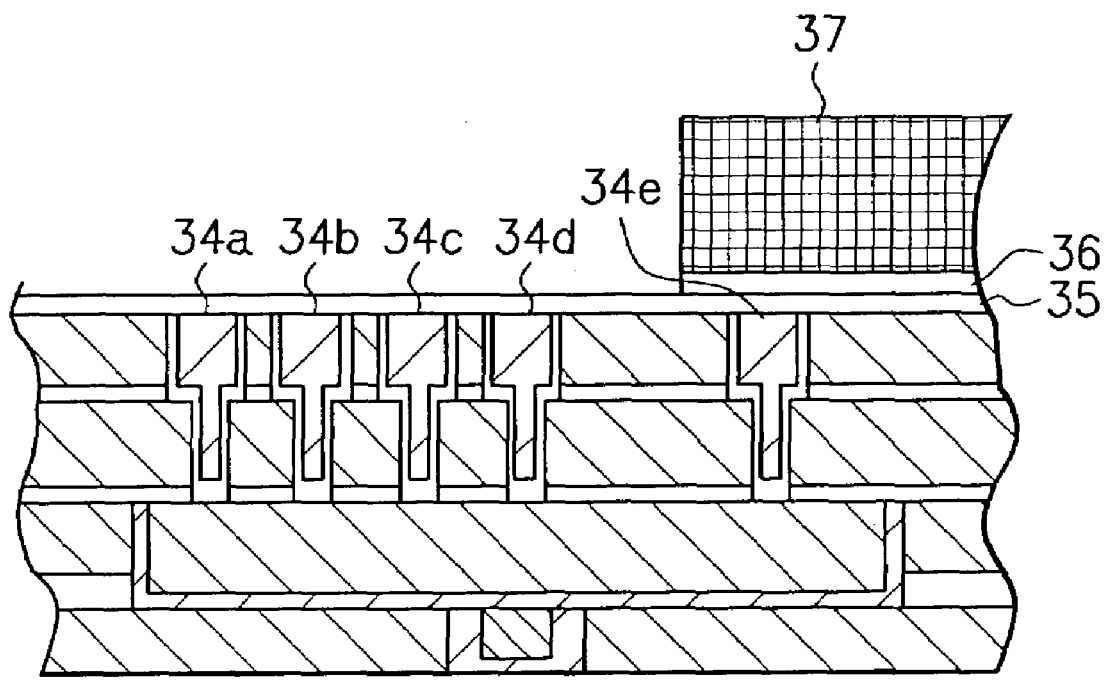
FIG. 8A and FIG. 8B are diagrammatic sectional views showing the semiconductor device manufacturing method according to the first embodiment in the order of its processes, subsequently to FIG. 7A and FIG. 7B.

Subsequently, as shown in FIG. 7B, a photo resist 37 is applied and a resist pattern which opens above the second wirings 34a to 34d is formed by photolithography. Next, as shown in FIG. 8A, with the photo resist 37 used as a mask, the silicon oxide film 36 is reactively ion-etched and then, the photo resist 37 is removed by ashing or the like.

Figure 8B:
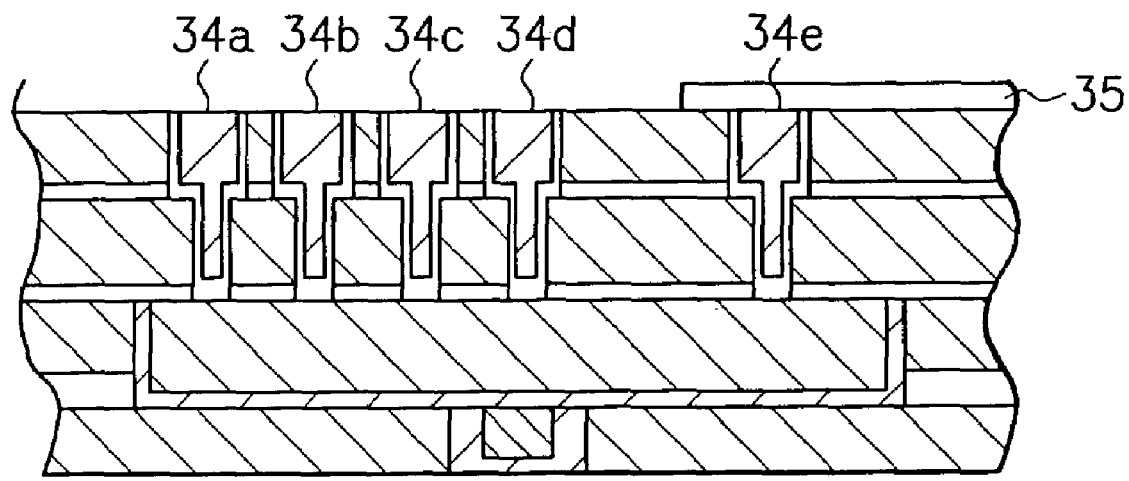

Subsequently, as shown in FIG. 8B, with the residual silicon oxide film 36 used as a hard mask, the silicon nitride film 35 is reactively ion-etched to expose the surfaces of the second Cu wirings 34a to 34d.

Subsequently, as shown in FIG. 9A, a nitride titanium film 38, a silicon oxide film 39, and a nitride titanium film 40 are formed in sequence to be about 100 nm, about 40 nm, and about 150 nm in film thickness respectively. Here, the nitride titanium films 38, 40 are formed by a sputtering method and the silicon oxide film 39 is formed using a CVD method.

Subsequently, as shown in FIG. 9B, in order to demarcate a region where the MIM capacitor is to be formed, a photo resist 42 is applied and a resist pattern which opens above the second wiring 34e is formed by photolithography.

Figure 10A:
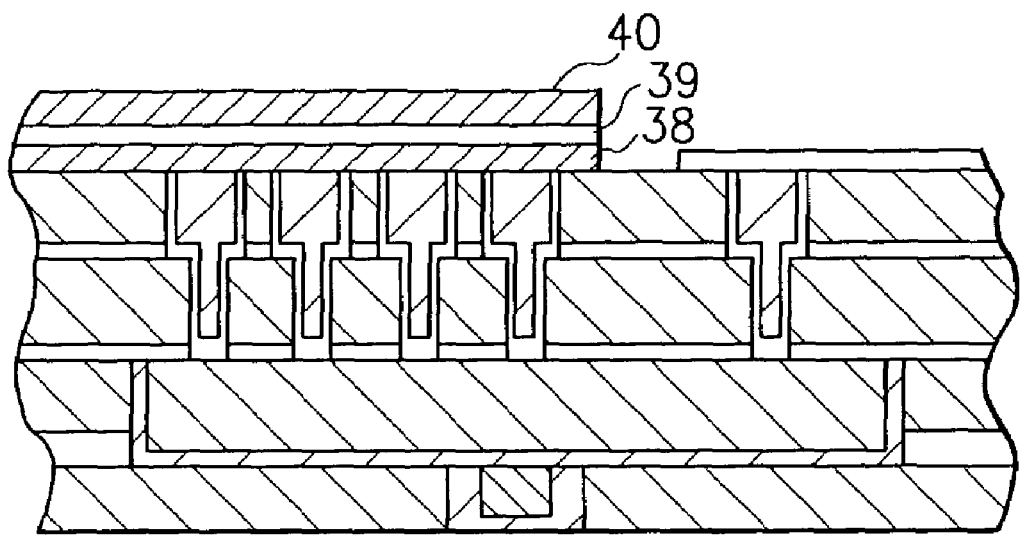
FIG. 10A and FIG. 10B are diagrammatic sectional views showing the semiconductor device manufacturing method according to the first embodiment in the order of its processes, subsequently to FIG. 9A and FIG. 9B.

Next, as shown in FIG. 10A, with the photo resist 42 used as a mask, the nitride titanium film 40, the silicon oxide film 39, and the nitride titanium film 38 are reactively ion-etched, and then, the photo resist 42 is removed by ashing or the like. Thereby, the MIM capacitor is formed in which the nitride titanium films 40, 38 serve as an upper electrode and a lower electrode respectively and the silicon oxide film 39 serves as a dielectric layer.

Figure 10B:
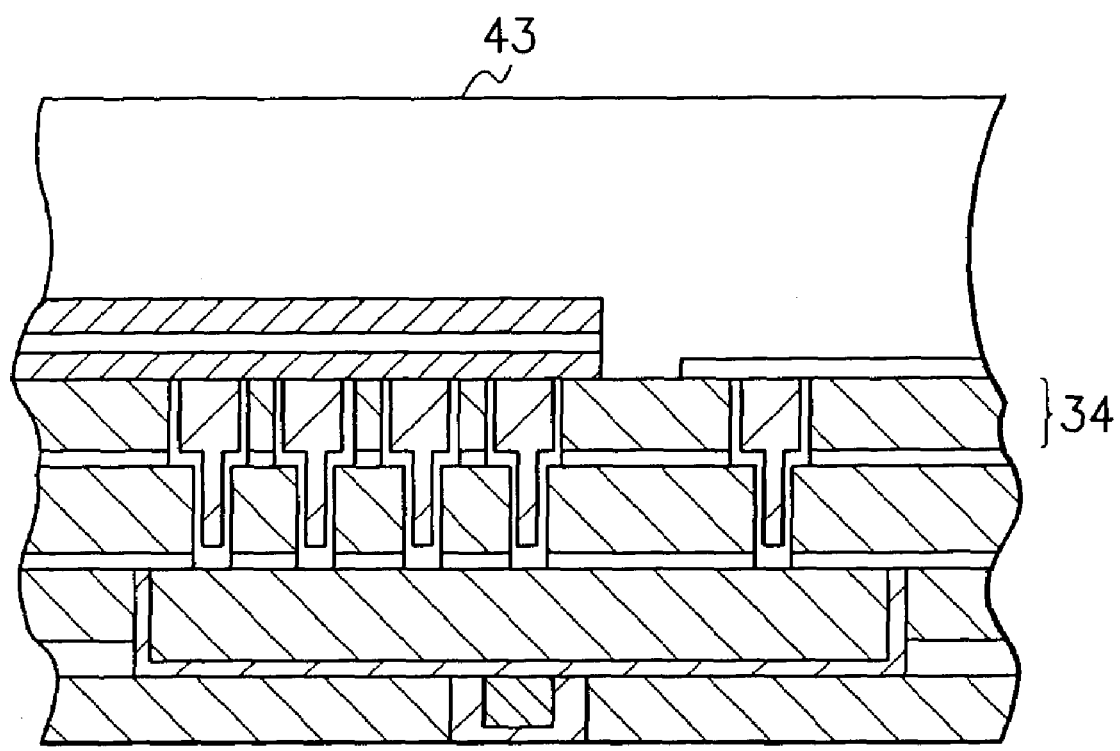

Subsequently, as shown in FIG. 10B, an interlayer insulation film 43 comprised of oxide silicon is formed by a CVD method or the like to be about 1100 nm in film thickness. Next, the interlayer insulation film 43 is polished by a CMP method so that the film thickness thereof becomes about 730 nm from the surface of the second wiring layer 34 including the second Cu wirings 34a to 34e.

Figure 11A:
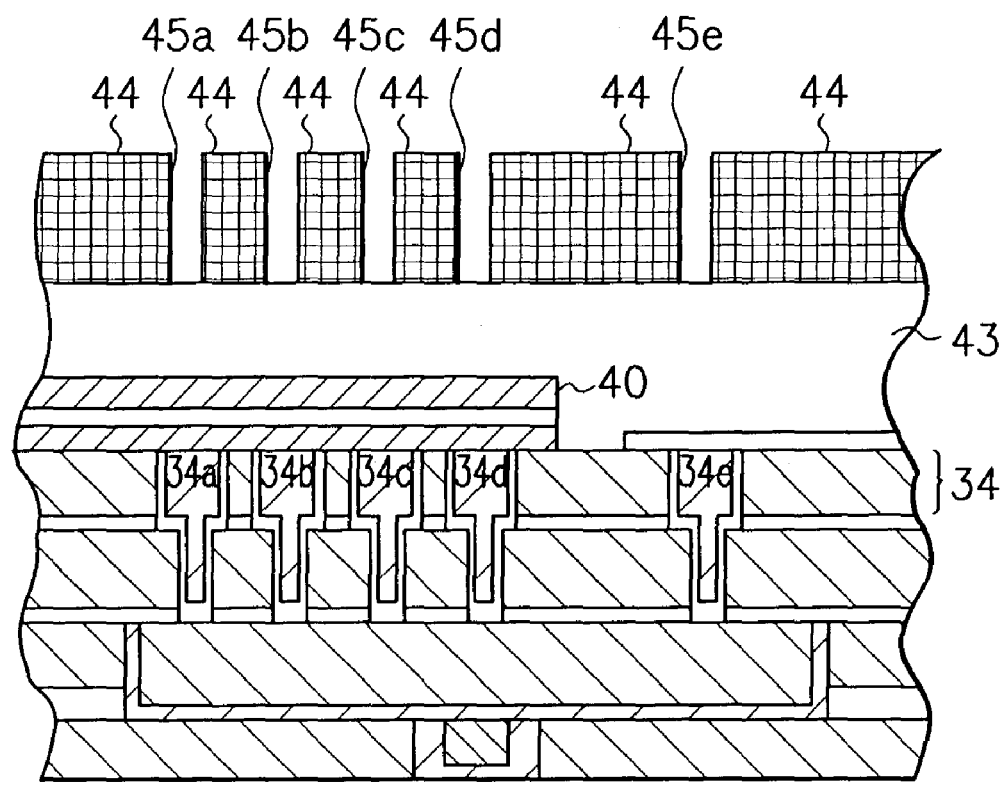
FIG. 11A and FIG. 11B are diagrammatic sectional views showing the semiconductor device manufacturing method according to the first embodiment in the order of its processes, subsequently to FIG. 10A and FIG. 10B.

Next, as shown in FIG. 11A, a photo resist 44 is applied on the interlayer insulation film 43 and processed by photolithography to form plug patterns 45a to 45d which are openings above the MIM capacitor and a plug pattern 45e which is an opening above the second Cu wiring 34e.

Figure 11B:
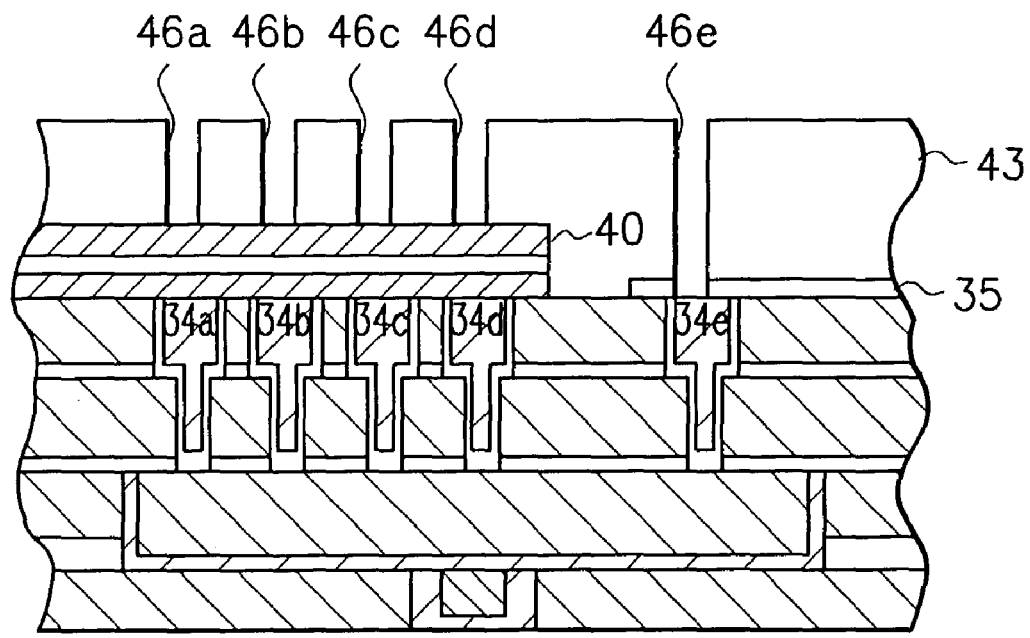

Subsequently, as shown in FIG. 11B, via holes 46a to 46e are formed by reactive ion etching with the photo resist 44 used as a mask, and the photo resist 44 is removed by ashing or the like.

Figure 12A:
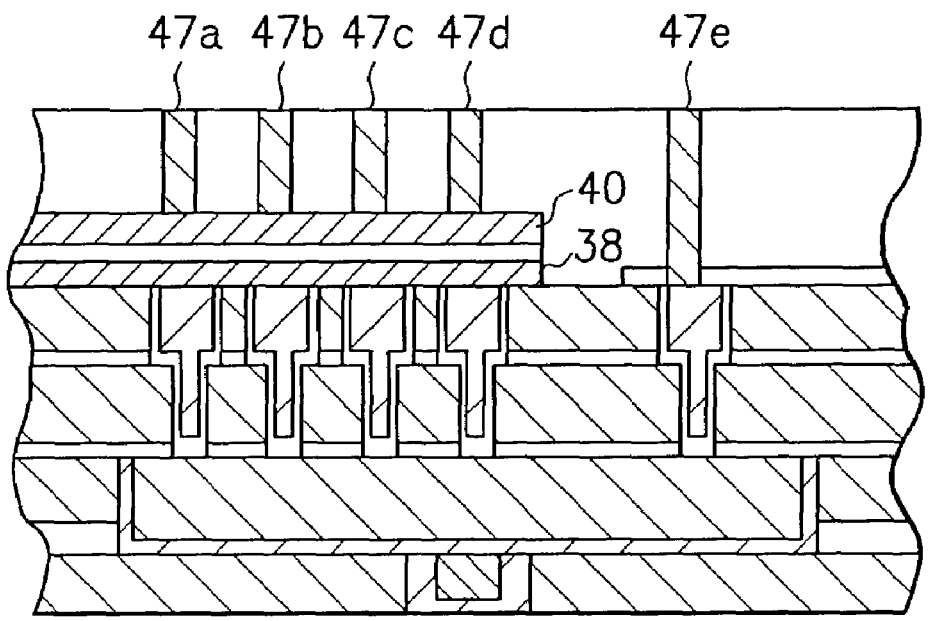
FIG. 12A and FIG. 12B are diagrammatic sectional views showing the semiconductor device manufacturing method according to the first embodiment in the order of its processes, subsequently to FIG. 11A and FIG. 11B.

Subsequently, as shown in FIG. 12A, a metal such as tungsten is selectively grown in each of the via holes 46a to 46e to flatten the surface by a CMP method. Thereby, plugs 47a to 47d of the upper electrode 40 and a plug 47e of the lower electrode 38 of the MIM capacitor are formed respectively.

Figure 12B:
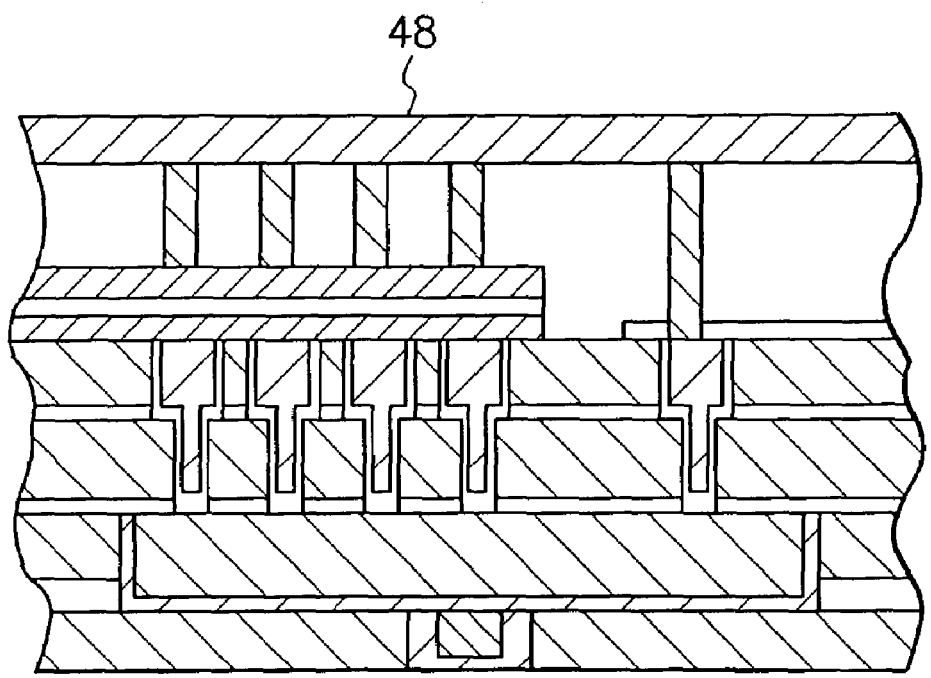
Figure 13A:
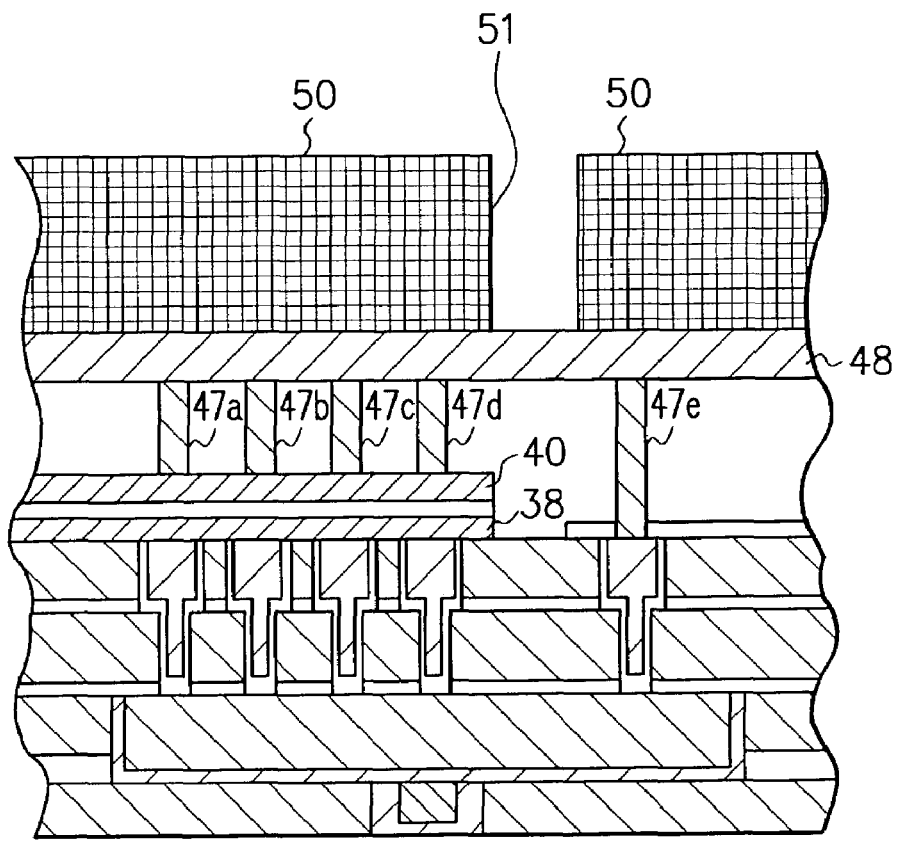
FIG. 13A and FIG. 13B are diagrammatic sectional views showing the semiconductor device manufacturing method according to the first embodiment in the order of its processes, subsequently to FIG. 12A and FIG. 12B.

Subsequently, as shown in FIG. 12B, an aluminum film 48 is formed on the entire surface by a sputtering method. Next, as shown in FIG. 13A, a photo resist 50 is applied and processed by photolithography to form a separation pattern 51 which opens above a region between the plugs 47a to 47d of the upper electrode 40 and the plug 47e of the lower electrode 38.

Figure 13B:
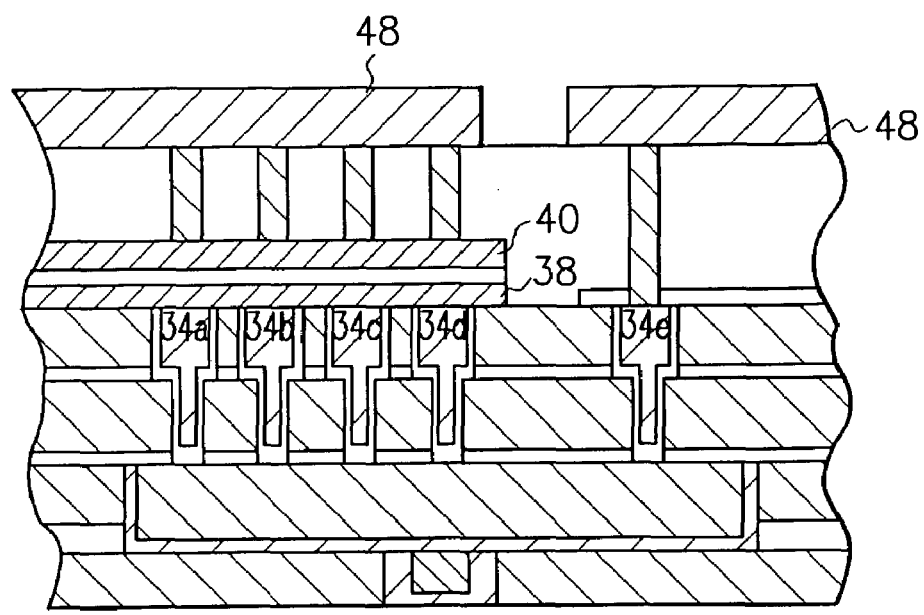

Subsequently, as shown in FIG. 13B, the aluminum 48 is dry-etched according to the separation pattern 51 to form an aluminum wiring 48.

FIG. 14 is a diagrammatic plan view of the semiconductor device according to the first embodiment. In the semiconductor device according to this embodiment, the surfaces of the second Cu wirings 34a to 34e are completely covered with the lower electrode comprised of TiN and the silicon nitride film as shown in FIG. 14. This makes it possible to prevent the Cu diffusion to the interlayer insulation film. Furthermore, in the semiconductor device according to this embodiment, no step is caused in the MIM capacitor so that capacity precision is maintained.

<Comparison 1>

Figure 40A:
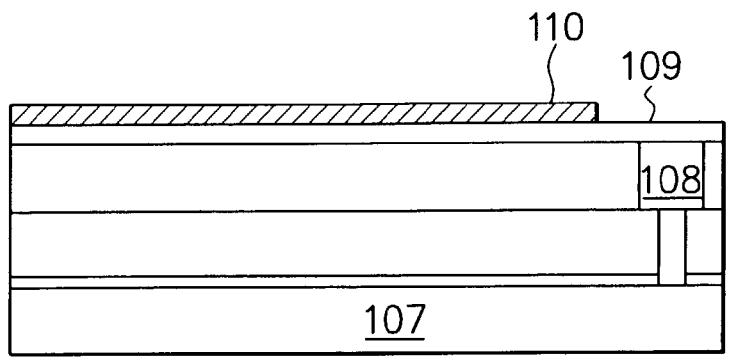
FIG. 40A, FIG. 40B, and FIG. 40C are diagrammatic sectional views showing a semiconductor device manufacturing method according to Comparison 1.
Figure 40B:
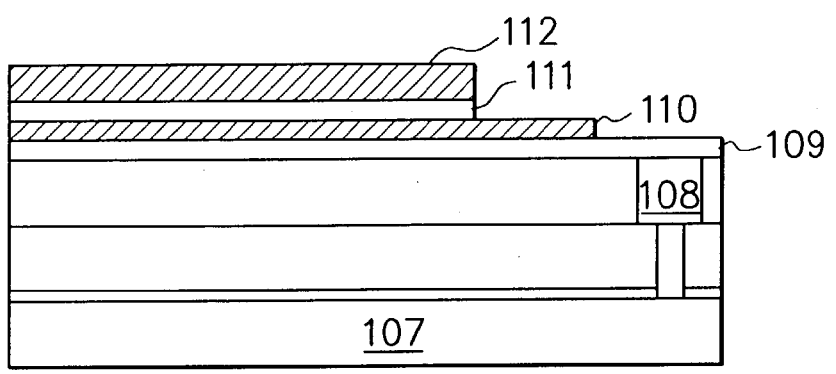
Figure 40C:
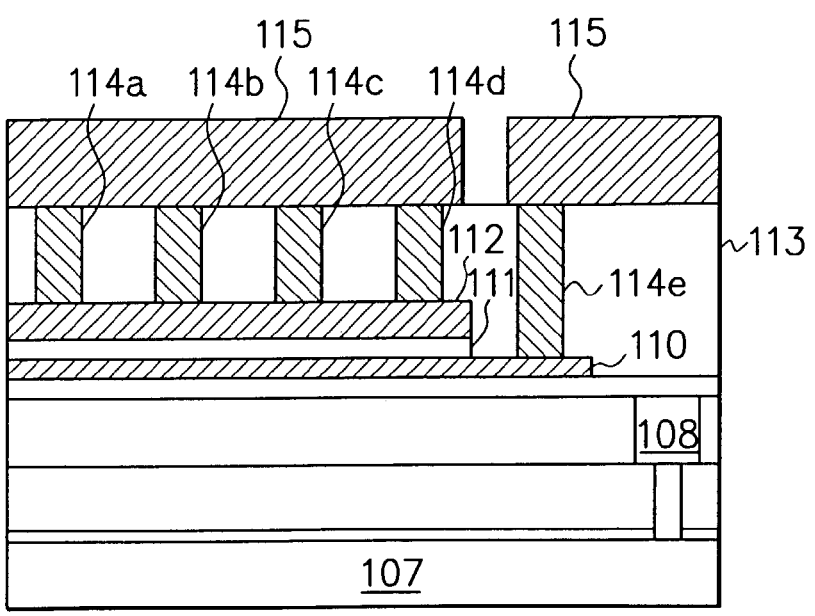

Here, structure examples of an MIM capacitor which can be formed on a multilayered structure inclusive of Cu wirings similarly to the first embodiment described above will be explained as Comparisons 1 to 3. Manufacturing processes of Comparison 1 are shown in FIG. 40A to FIG. 40C. In Comparison 1 to Comparison 3 which will be described below, a multilayered structure inclusive of Cu wirings constituted of, at least a two-layer structure of a first Cu wiring 107 and a second Cu wiring 108 is assumed as shown in FIG. 40A.

First, a silicon nitride film 109 to be a diffusion preventive film of the second Cu wiring 108 and a nitride titanium film 110 to be a lower electrode of the MIM capacitor are formed on the multilayered structure inclusive of Cu wirings in sequence. Then, an aperture pattern which opens above the second Cu wiring 108 is formed on the nitride titanium film 110.

Subsequently, as shown in FIG. 40B, after a silicon oxide film 111 to be a dielectric layer of the MIM capacitor and a nitride titanium film 112 to be an upper electrode of the MIM capacitor are formed on the entire surface in sequence, the nitride titanium film 112 and the silicon oxide film 111 are patterned so as to form a plug pad region in a part of the lower electrode. Thereby, the plug pad region is formed in a part of the lower electrode and at the same time, the upper electrode of the MIM capacitor is formed.

Subsequently, as shown in FIG. 40C, an interlayer insulation film 113 comprised of, for example, BPSG is formed by a CVD method so as to cover the nitride titanium film 110, the silicon oxide film 111, and the nitride titanium film 112, and via holes from which the surfaces of the plug pad region of the lower electrode and the upper electrode are exposed are formed.

Next, tungsten is selectively grown in each of these via holes to form plugs 114a to 114d of the upper electrode and a plug 114e of the lower electrode respectively. After the surface is flattened by a CMP method, an upper wiring 115 comprised of an aluminum film is formed.

As shown in FIG. 40A, FIG. 40B, and FIG. 40C, Comparison 1 is so configured that the plug pad region is provided in a part of the lower electrode and the plug of a lower wiring is disposed on this pad region to supply an electrical charge to the lower electrode from the aluminum wiring 115 with the lower electrode itself and the plug serving as a passage. Especially when the MIM capacitor is applied to a high-frequency circuit, it is an important task to lower a resistance value of such an electrical charge supply passage in order to avoid decrease in a Q value which indicates sharpness of resonance of the high-frequency circuit.

In Comparison 1, however, the lower electrode is comprised of the nitride titanium film 110 whose resistance value is relatively high, and a plane surface direction of the lower electrode is the electrical charge supply passage. Consequently, the Q value is lowered due to the high resistance value of the electrical charge supply passage when Comparison 1 is applied to the high-frequency circuit. It can also be thought of to make the film thickness of the lower electrode itself large in order to lower this resistance value. But the interlayer insulation film 113 formed to cover the MIM capacitor is flattened to have a film thickness with a certain margin from the upper electrode of the MIM capacitor by a CMP process on a subsequent stage. Therefore, the larger the film thickness of the lower electrode becomes, the longer the plugs are made. As a result, the resistance of the electrical charge supply passage is also made higher. Therefore, the decrease in the Q value which is a value in inverse proportion to the resistance value cannot be avoided.

In the first embodiment of the present invention, on the other hand, the passage for supplying the electrical charge to the lower electrode is mainly constituted of the first Cu wiring 20 and the second Cu wirings 34a to 34e whose resistance values are relatively low so that the decrease in the resistance of the electrical charge supply passage is achieved.

Furthermore, this embodiment is so configured that the second Cu wirings 34a to 34d are disposed directly under the lower electrode and the thickness direction of the lower electrode is the electrical charge supply passage. In this configuration, the resistance can be lowered more as the film thickness of the lower electrode is made smaller. Furthermore, the plugs can be formed to be short in accordance with the thinner formation of the lower electrode. As a result, the resistance value of the passage for supplying the electrical charge from the upper wiring 48 can be greatly lowered.

<Comparison 2>

Next, Comparison 2 will be explained.

Figure 41:
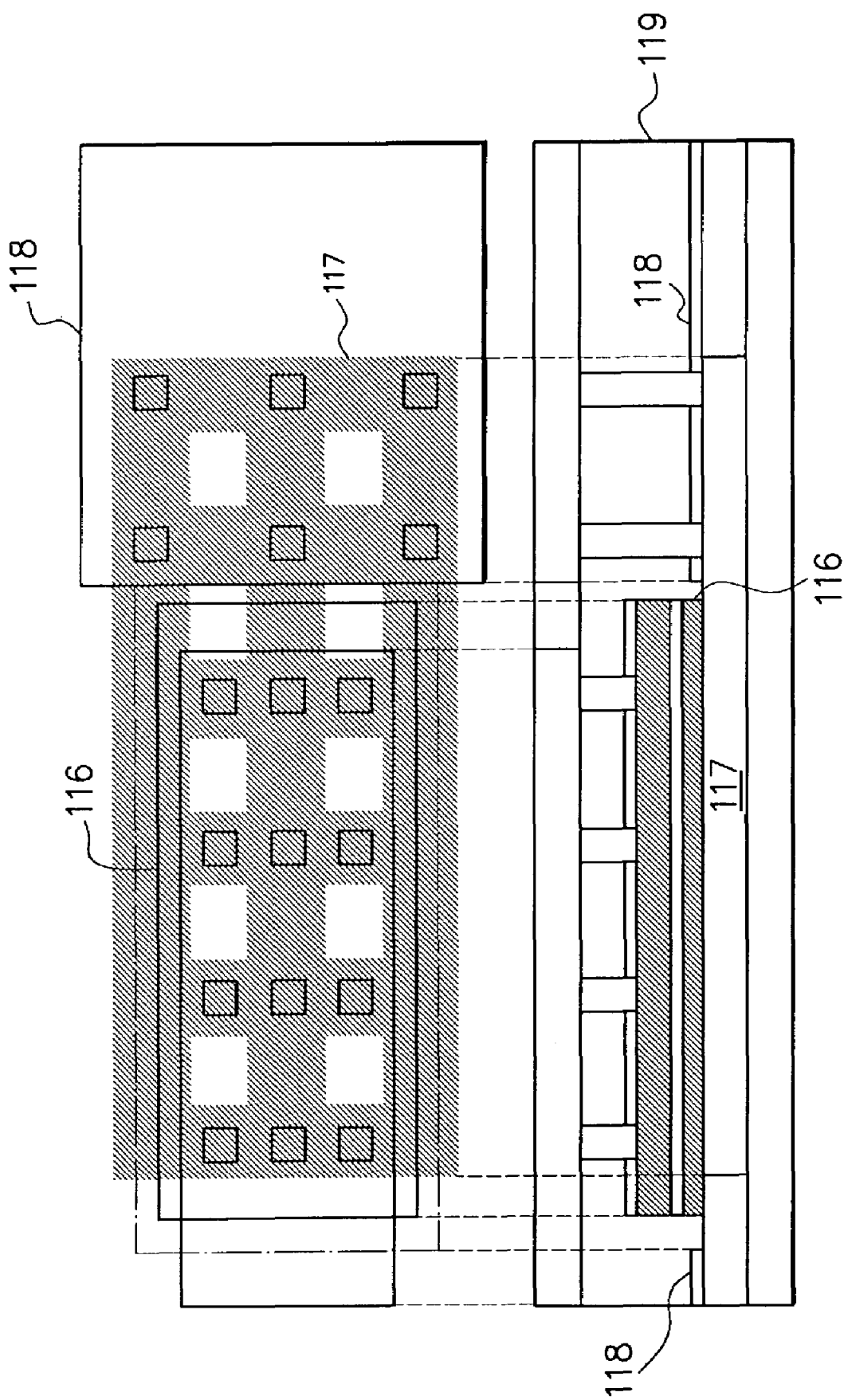
FIG. 41 is a diagrammatic plan view and a diagrammatic sectional view showing the structure of a semiconductor device according to Comparison 2.

This comparison is an example in which a Cu wiring layer is formed directly under a lower electrode of an MIM capacitor. In Comparison 2, as shown in FIG. 41, an opening region is formed in a part of a silicon nitride film 118 in order to bring a lower electrode 116 and a Cu wiring layer 117 into contact with each other. Furthermore, the MIM capacitor is formed to be embraced by this opening region. Thereby, Cu diffusion to an interlayer insulation film 119 from the Cu wiring layer 117 is prevented by the SiN film 118 and the lower electrode 116 of the MIM capacitor.

In Comparison 2, however, since a portion of the Cu wiring layer 117 is exposed from a part of the aforesaid opening region due to the problem of patterning precision in forming the MIM capacitor, the Cu diffusion from that portion cannot be avoided. This mars reliability of a function of the wiring due to insulation destruction.

In the first embodiment of the present invention, on the other hand, the surfaces of the Cu wirings 34a to 34e are completely embraced by the lower electrode of the MIM capacitor and the silicon nitride film 35. Consequently, the Cu diffusion to the interlayer insulation film 119 can be prevented without fail. This can maintain the reliability of the function of the wiring. Note that 'embrace' mentioned here means that the lower electrode completely covers the surface of the Cu wiring.

<Comparison 3>

In Comparison 3, as shown in FIG. 42, an MIM capacitor is patterned in a shape so as to completely cover the aforesaid opening region in order to prevent the exposure of the portion of the Cu wiring layer 117 from the opening region. This can avoid the exposure of the Cu wiring layer 117 from a part of the opening portion. However, a problem in terms of capacity precision occurs due to a poor step covering property of the MIM capacitor.

In the first embodiment of the present invention, on the other hand, flatness of the MIM capacitor is secured. Therefore, the degradation of the capacity precision caused by the aforesaid poor step covering property can be avoided.

<Second Embodiment>

Next, a second embodiment of the present invention will be explained. Since manufacturing processes of a multilayered structure inclusive of Cu wirings of this embodiment are the same as those in FIG. 2A to FIG. 8B which are explained in the first embodiment, processes subsequent to them will be explained.

Figure 15A:
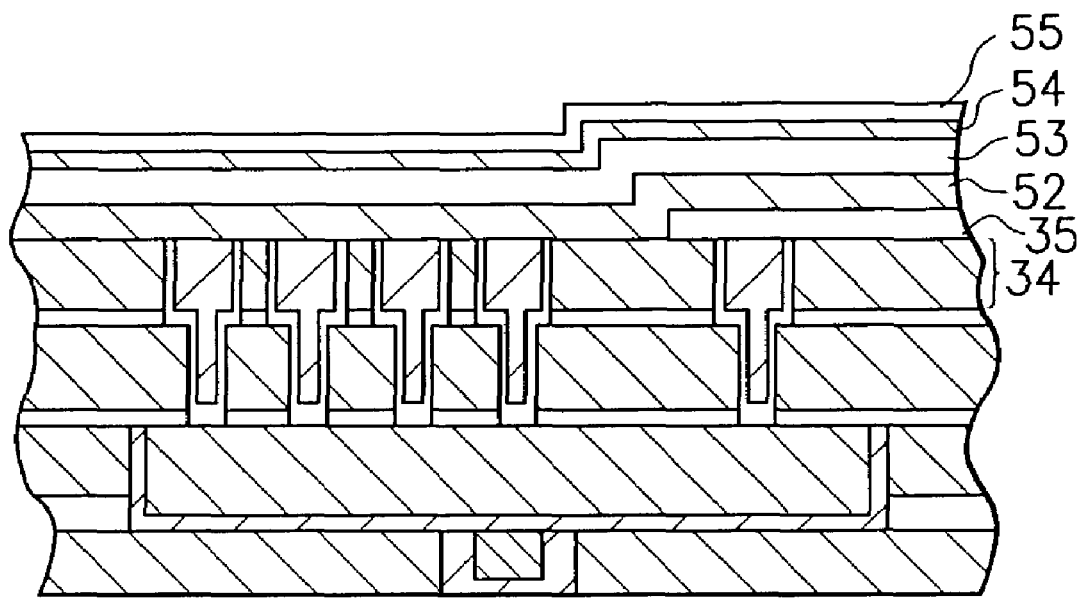
FIG. 15A and FIG. 15B are diagrammatic sectional views showing a semiconductor device manufacturing method according to a second embodiment of the present invention in the order of its processes.

First, as shown in FIG. 15A, a nitride titanium film 52, a silicon oxide film 53, a nitride titanium film 54, and a silicon nitride film 55 are formed in sequence on a second Cu wiring layer 34 and a silicon nitride film 35. At this time, the nitride titanium film 52, the silicon oxide film 53, the nitride titanium film 54, and the silicon nitride film 55 are formed by depositing to be about 100 nm, about 40 nm, about 50 nm, and about 70 nm in film thickness respectively.

Figure 15B:
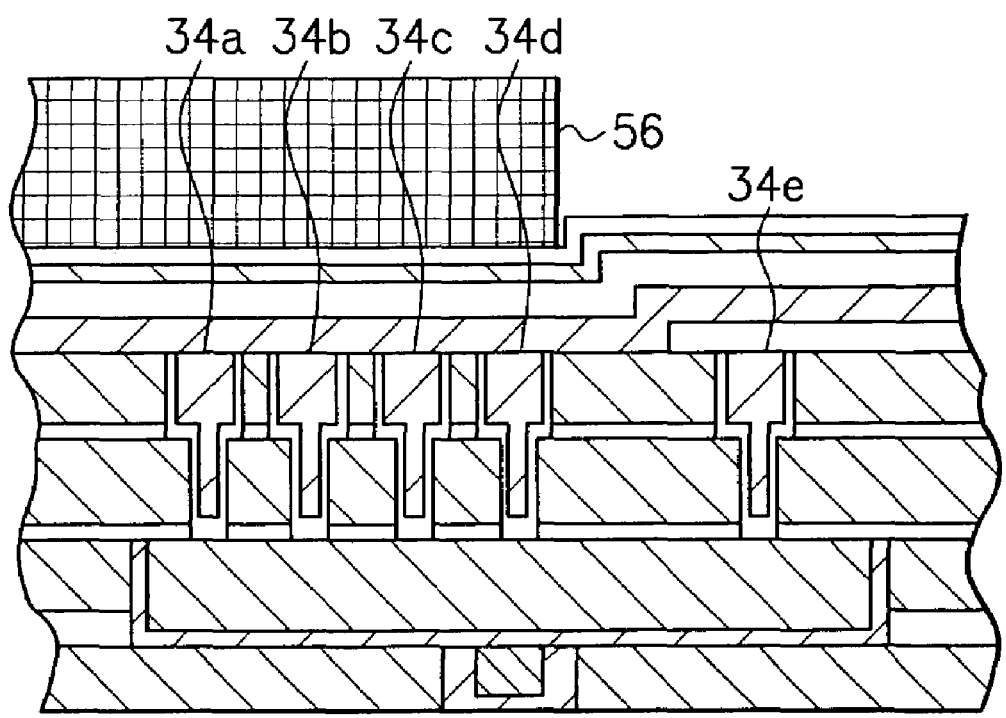

Subsequently, as shown in FIG. 15B, in order to demarcate a region in which an MIM capacity section is to be formed, a photo resist 56 is applied and a resist pattern which opens above a second wiring 34e is formed by photolithography.

Figure 16A:
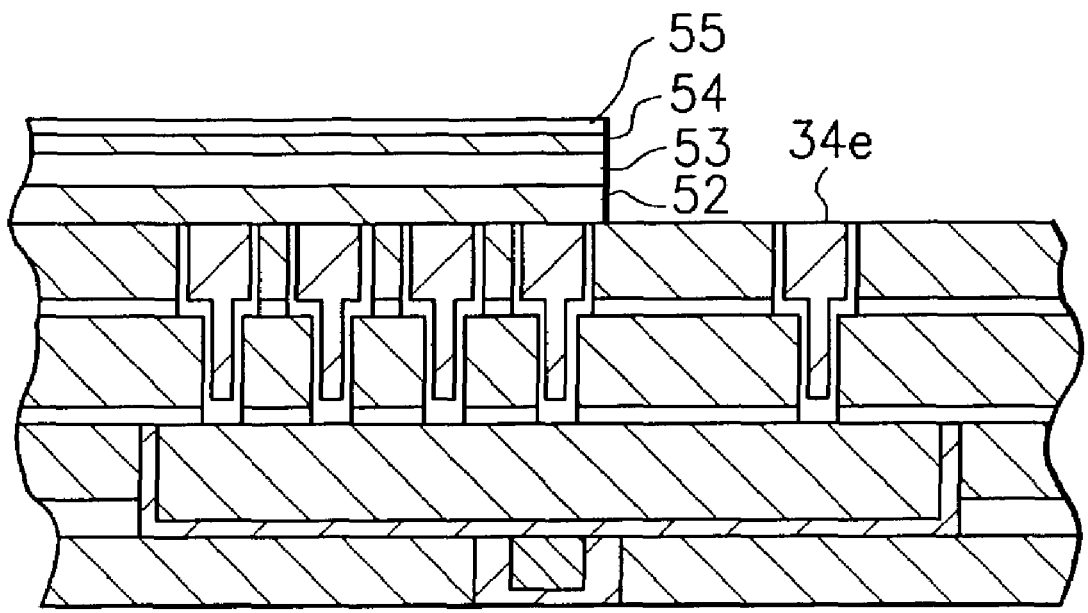
FIG. 16A and FIG. 16B are diagrammatic sectional views showing the semiconductor device manufacturing method according to the second embodiment in the order of its processes, subsequently to FIG. 15A and FIG. 15B.

Next, as shown in FIG. 16A, with the photo resist 56 used as a mask, the silicon nitride film 55, the nitride titanium film 54, the silicon oxide film 53, and the nitride titanium film 52 are reactively ion-etched, and then, the photo resist 56 is removed by ashing or the like.

Figure 16B:
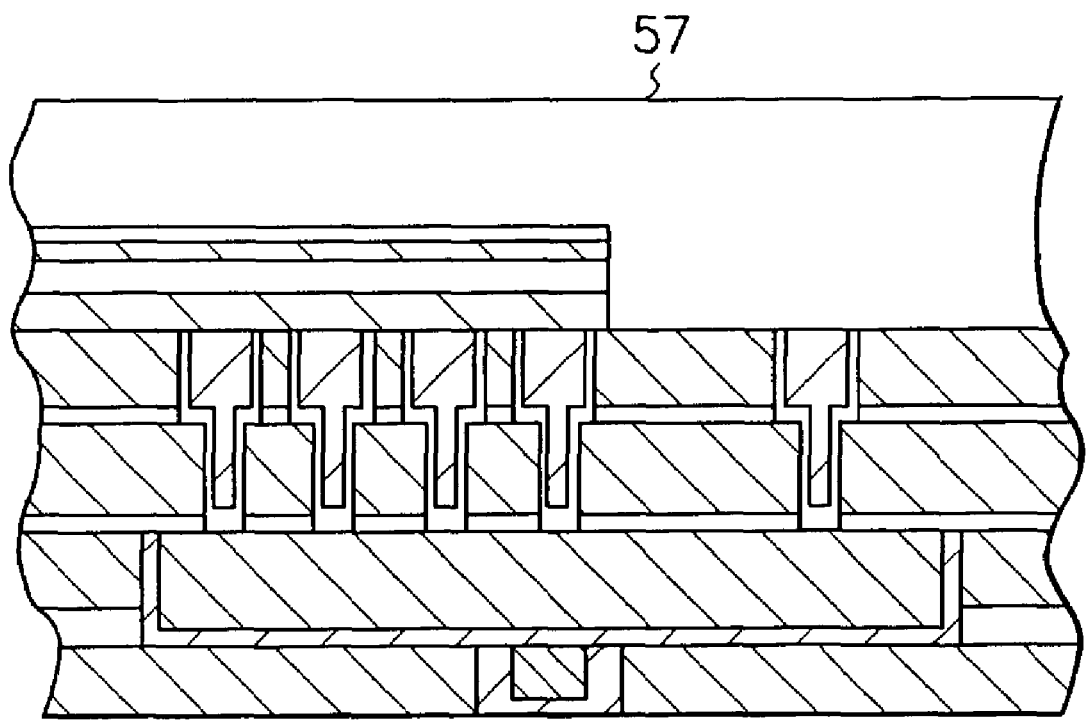

Subsequently, as shown in FIG. 16B, after an interlayer insulation film 57 comprised of a silicon oxide film is formed by a CVD method to be about 1400 nm in film thickness, the surface of the interlayer insulation film 57 is flattened by a CMP method so that the film thickness of the interlayer insulation film 57 becomes about 730 nm from the surface of the second wiring layer 34.

Figure 17A:
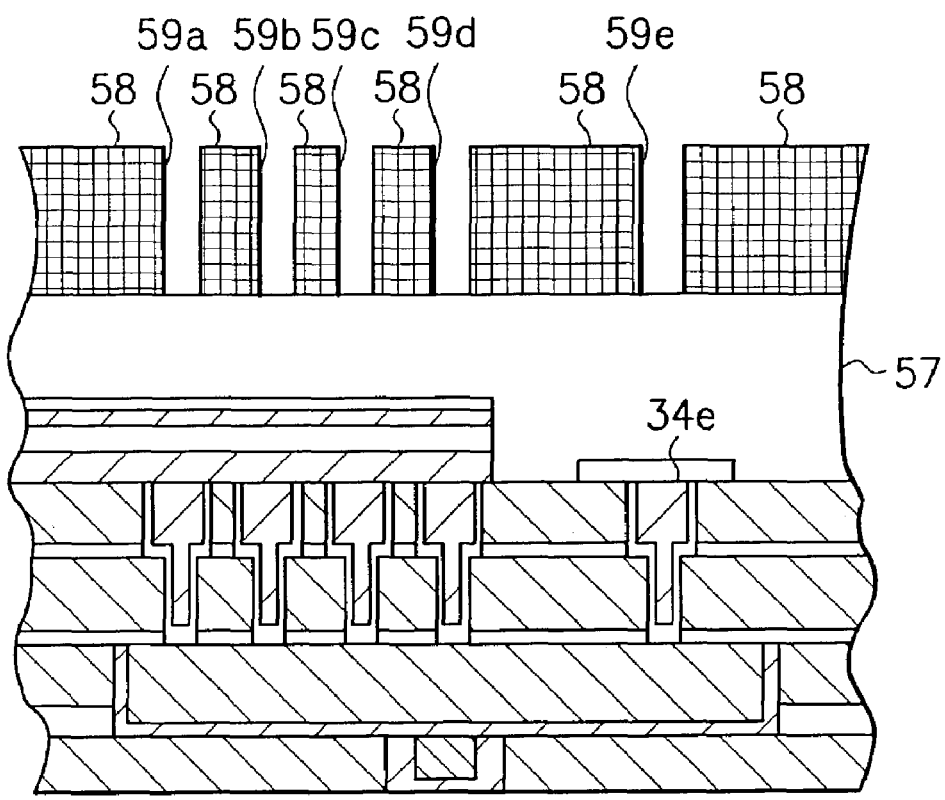
FIG. 17A and FIG. 17B are diagrammatic sectional views showing the semiconductor device manufacturing method according to the second embodiment in the order of its processes, subsequently to FIG. 16A and FIG. 16B.

Subsequently, as shown in FIG. 17A, a photo resist 58 is applied and a plurality of plug patterns 59a to 59d which are openings above an MIM capacitor and a plug pattern 59e which is an opening above the second wiring 34e are formed by photolithography.

Figure 17B:
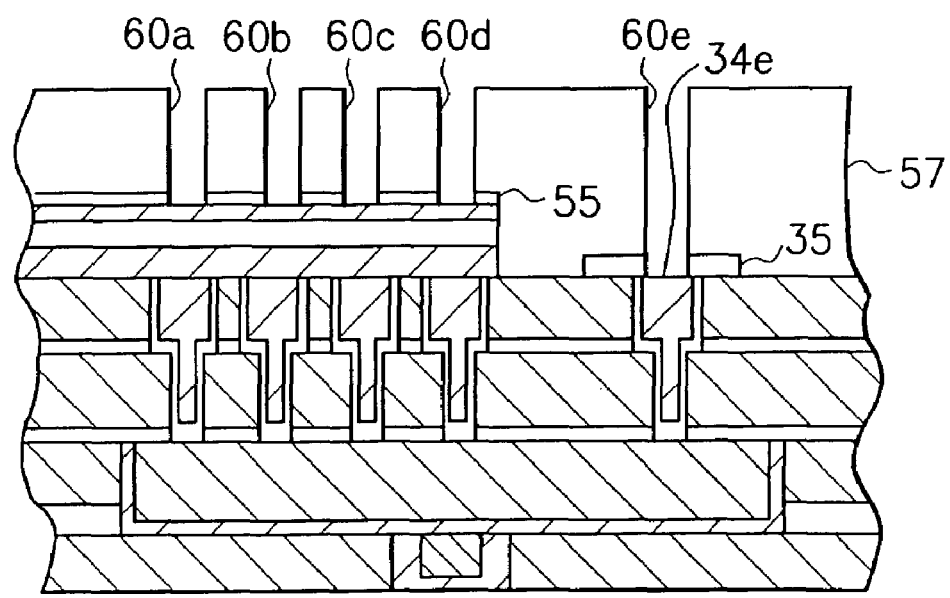

Subsequently, as shown in FIG. 17B, with the photo resist 58 used as a mask, the interlayer insulation film 57, the silicon nitride film 56, and the silicon oxide film 53 are reactively ion-etched until the surfaces of an upper electrode 54 and the second Cu wiring 34e are exposed so that via holes 60a to 60e are formed.

Subsequently, as shown in FIG. 18A, a metal such as tungsten is selectively grown in each of the via holes 60a to 60e, and the surface is polished by a CMP method to be flattened. Thereby, plugs 61a to 61d of the upper electrode 54 and a plug 61e of a lower electrode 52 of the MIM capacitor are formed respectively.

Figure 19A:
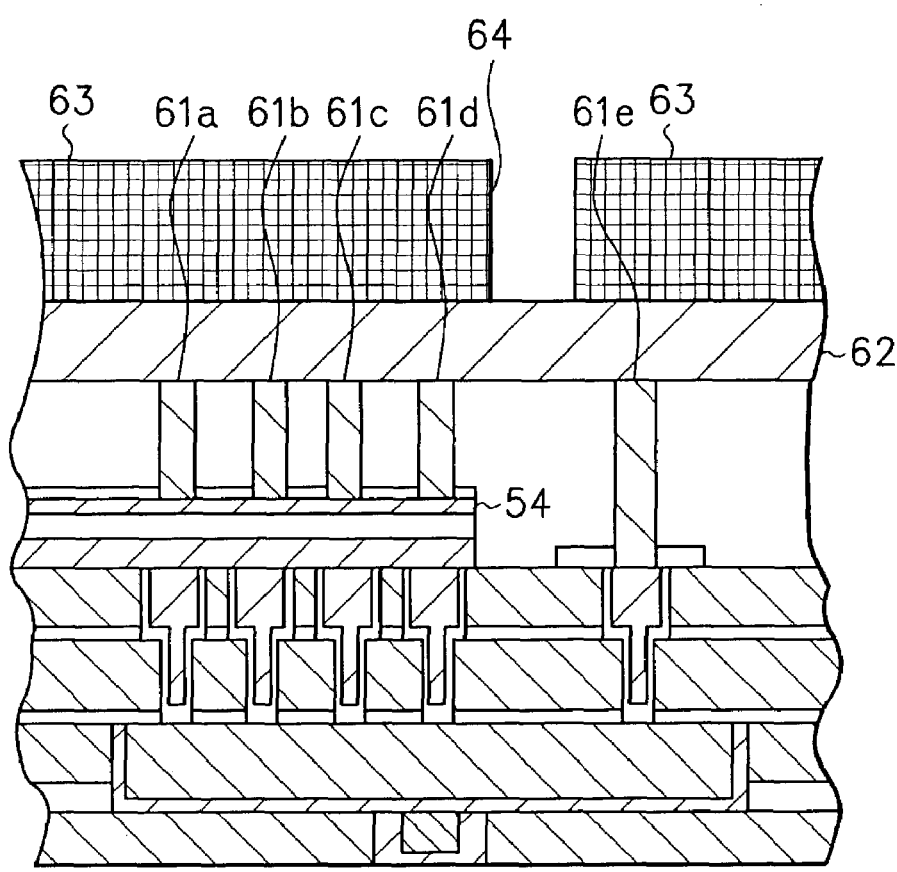
FIG. 19A and FIG. 19B are diagrammatic sectional views showing the semiconductor device manufacturing method according to the second embodiment in the order of its processes, subsequently to FIG. 18A and FIG. 18B.

Subsequently, as shown in FIG. 18B, an aluminum film 62 is formed by depositing using a sputtering method. Next, as shown in FIG. 19A, a photo resist 63 is applied and a separation pattern 64 which opens above a region between the plugs 61a to 61d of the upper electrode 54 and the plug 61e of the lower electrode 52 is formed by photolithography.

Figure 19B:
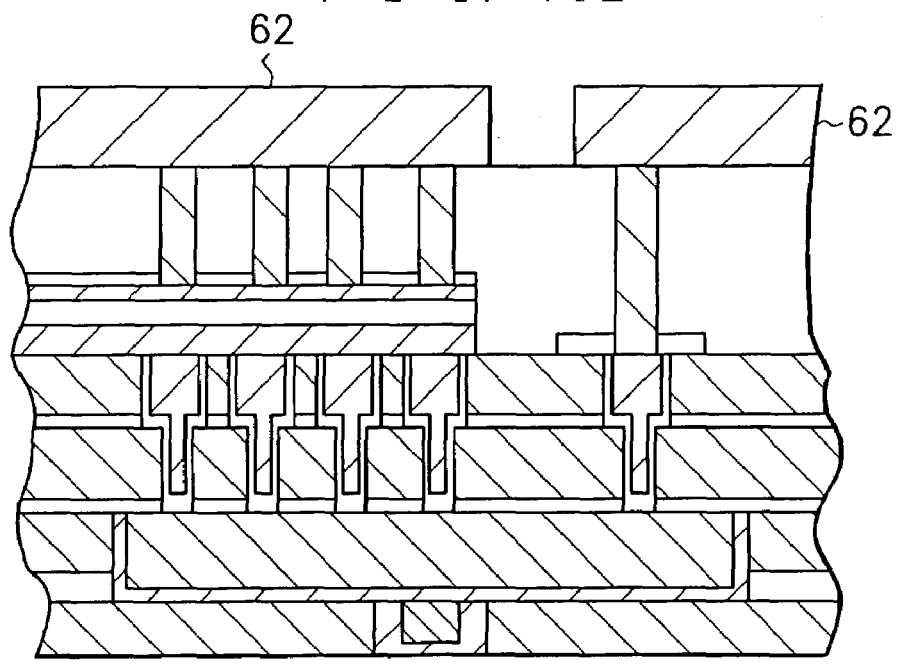

Subsequently, as shown in FIG. 19B, the aluminum film 62 is dry-etched to form an aluminum wiring 62.

As described above, according to the second embodiment of the present invention, flatness of the MIM capacitor is secured so that capacity precision can be maintained. In addition, since the second Cu wiring is completely covered with the lower electrode and the silicon nitride film, Cu diffusion to the interlayer insulation film can be prevented without fail.

At the time of forming the via holes, the upper electrode is also etched while the interlayer insulation film between the height of the surface of the upper electrode and the surface of the plug pad is etched. Therefore, the upper electrode needs to have a film thickness having a margin to such an extent that it is not completely perforated by the etching. In order to prevent the perforation, in this embodiment, the silicon nitride film working as an etching stopper is formed on the upper electrode. Therefore, the film thickness of the upper electrode does not need to have the aforesaid margin. As a result, the film thickness of the upper electrode can be reduced accordingly.

The interlayer insulation film formed to cover the MIM capacitor is polished, maintaining a certain margin from the surface of the upper electrode by a CMP process on a subsequent stage. Therefore, in this embodiment in which the film thickness of the upper electrode can be made small, the interlayer insulation film can be polished to be further thinner in the CMP process. In accordance with this, the plug of the lower electrode can be formed to be short. Therefore, according to this embodiment, the resistance of a passage for supplying an electrical charge to the lower electrode can be further lowered.

<Third Embodiment>

Next, a third embodiment of the present invention will be explained. Since manufacturing processes of a multilayered structure inclusive of Cu wirings of this embodiment are the same as those in FIG. 2A to FIG. 6B which are explained in the first embodiment, processes subsequent to them will be explained.

Figure 20A:
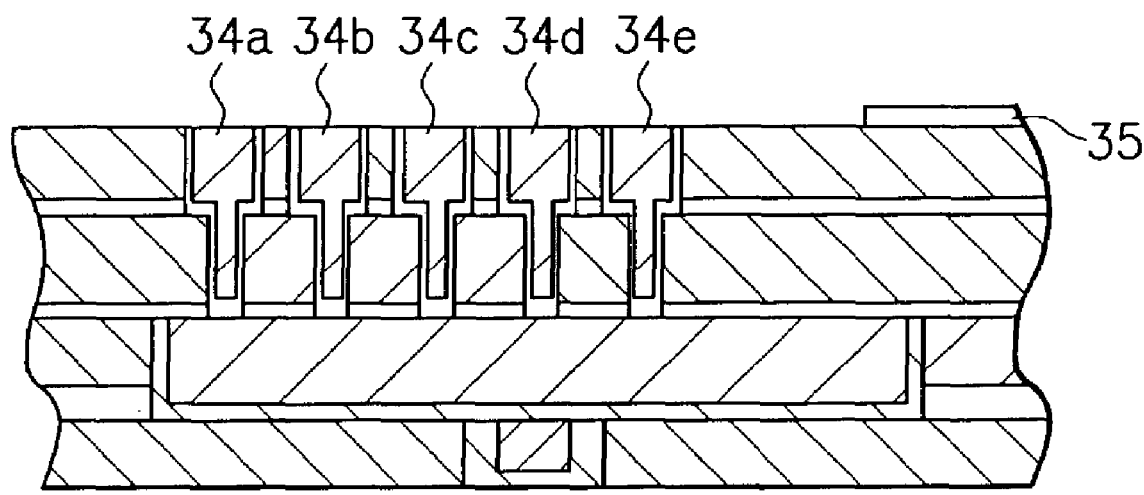
FIG. 20A and FIG. 20B are diagrammatic sectional views showing a semiconductor device manufacturing method according to a third embodiment of the present invention in the order of its processes.

First, after the same processes as those in FIGS. 7A to FIG. 8B, a nitride silicon film 35 is formed on the surface of a second Cu wiring layer except an MIM capacitor forming region, as shown in FIG. 20A.

Figure 20B:
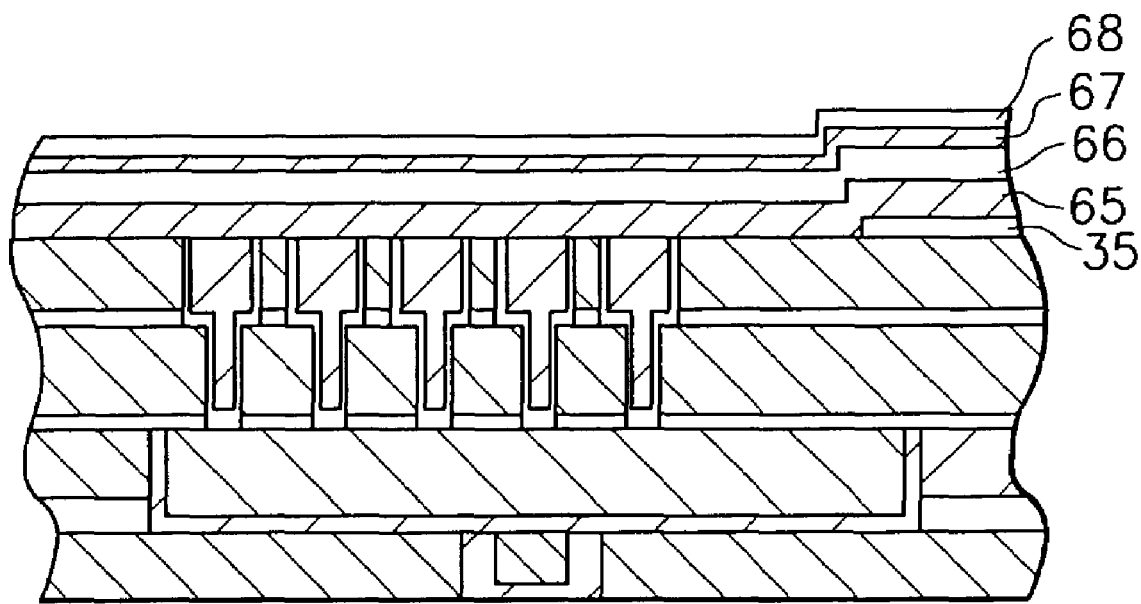

Next, as shown in FIG. 20B, a nitride titanium film 65, a silicon oxide film 66, a nitride titanium film 67, and a silicon nitride film 68 are formed in sequence to be about 100 nm, about 40 nm, about 50 nm, and about 70 nm in film thickness respectively. Here, the nitride titanium films 65, 67 are formed by a sputtering method or the like and the silicon oxide film 66 and the silicon nitride film 68 are formed by a CVD method or the like.

Subsequently, as shown in FIG. 21A, in order to demarcate a region in which an upper electrode of an MIM capacitor is to be formed, a photo resist 69 is applied and processed by photolithography.

Next, as shown in FIG. 21B, with the photo resist 69 used as a mask, the silicon nitride film 68, the nitride titanium film 67, and the silicon oxide film 66 are reactively ion-etched and the photo resist 69 is remove by ashing or the like.

Figure 22A:
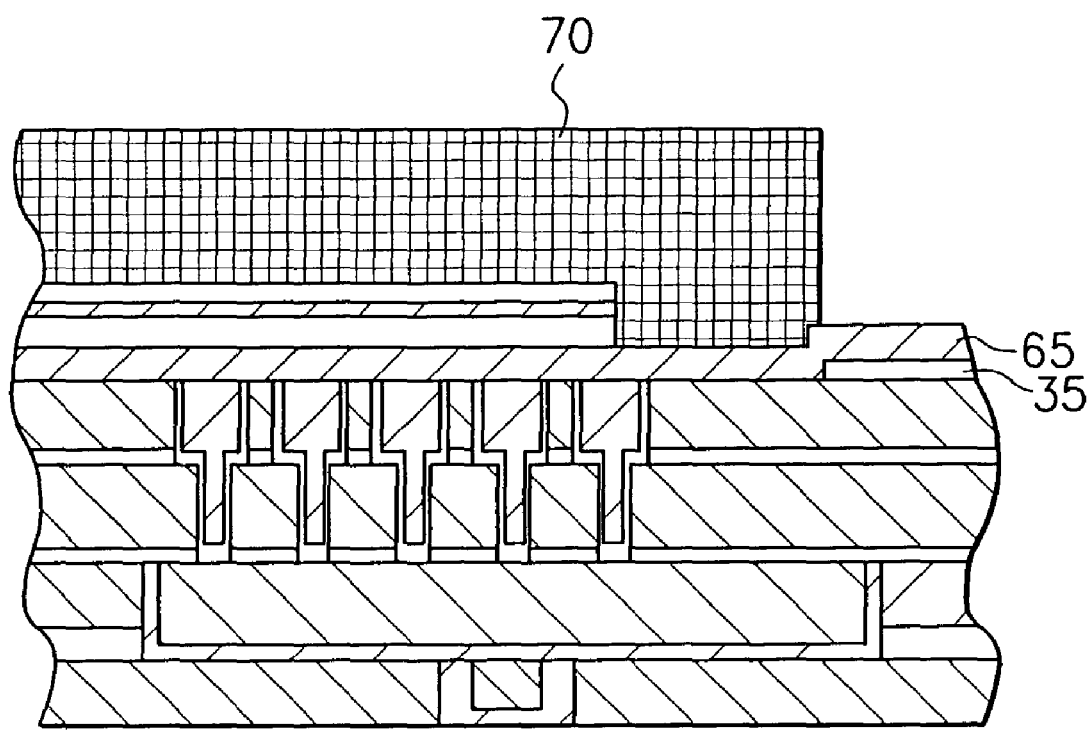
FIG. 22A and FIG. 22B are diagrammatic sectional views showing the semiconductor device manufacturing method according to the third embodiment in the order of its processes, subsequently to FIG. 21A and FIG. 21B.

Subsequently, as shown in FIG. 22A, in order to demarcate a region where a lower electrode of the MIM capacitor is to be formed, a photo resist 70 is applied and processed by photolithography in such a manner that the photo resist 70 is left above a region embracing second Cu wirings 34a to 34e.

Figure 22B:
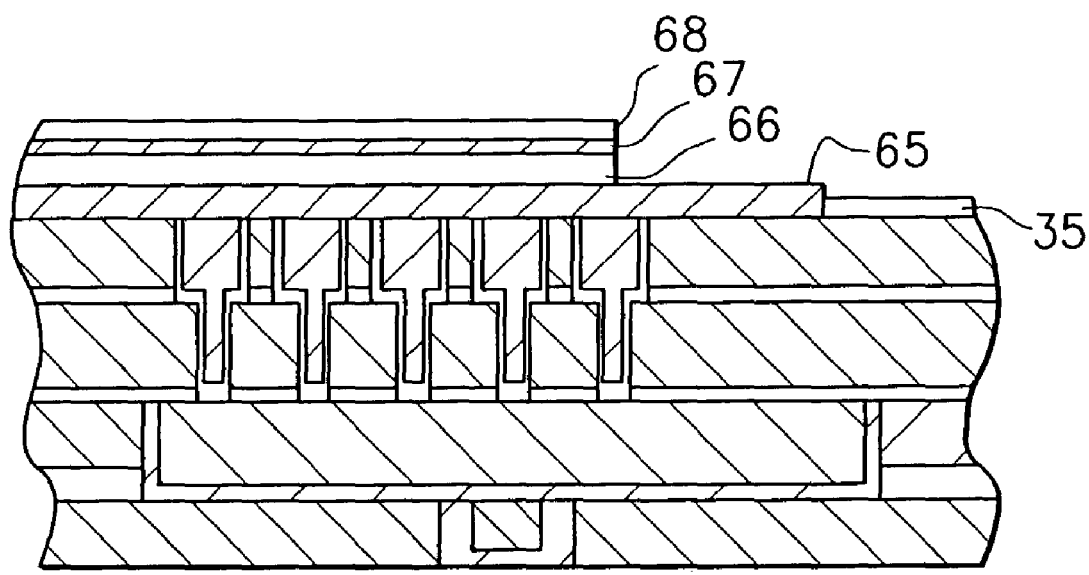

Next, as shown in FIG. 22B, with the photo resist 70 used as a mask, the nitride titanium film 65 is reactively ion-etched and the photo resist 70 is removed by ashing or the like. Thereby, the lower electrode 65 of the MIM capacitor is formed.

Figure 23A:
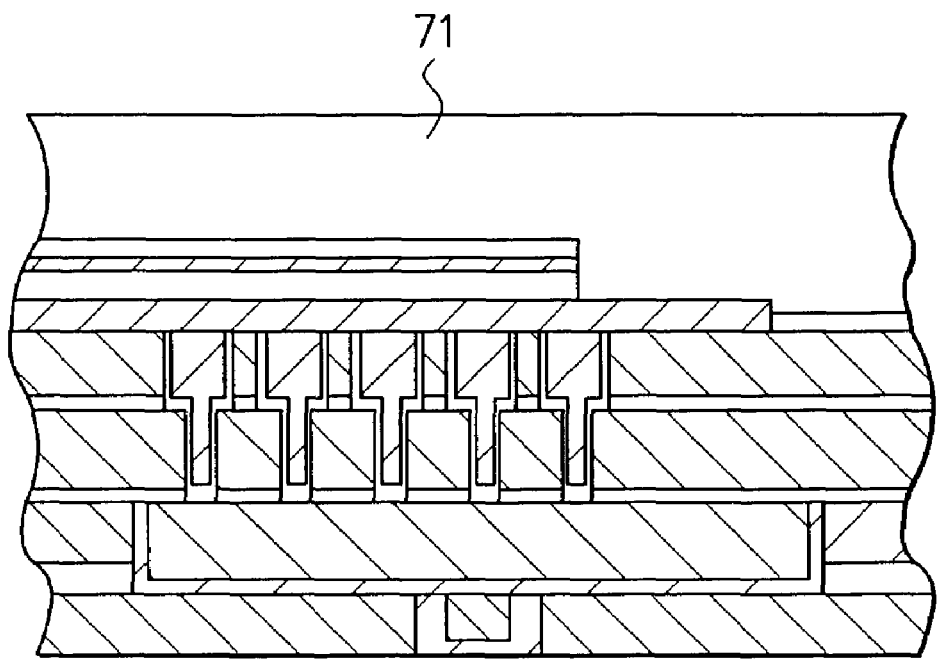
FIG. 23A and FIG. 23B are diagrammatic sectional views showing the semiconductor device manufacturing method according to the third embodiment in the order of its processes, subsequently to FIG. 22A and FIG. 22B.

Subsequently, as shown in FIG. 23A, after an interlayer insulation film 71 comprised of a silicon oxide film is formed by a CVD method or the like to be about 1400 nm in film thickness, the surface is flattened by a CMP method until the film thickness of the interlayer insulation film 71 becomes about 730 nm from the surface of the wirings.

Figure 23B:
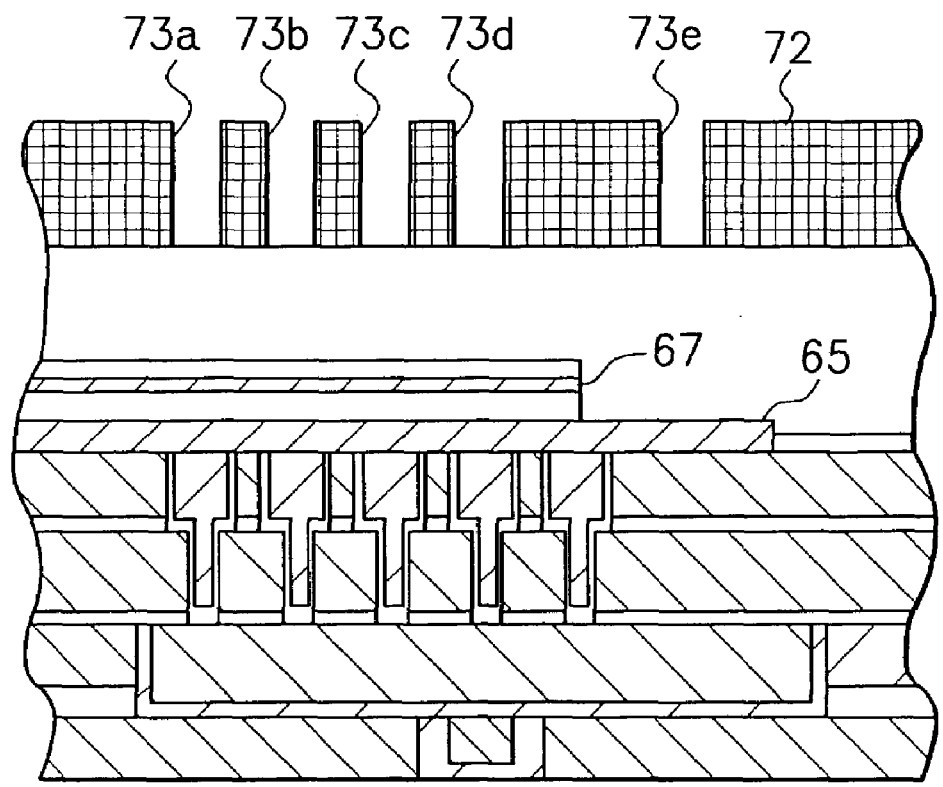

Subsequently, as shown in FIG. 23B, a photo resist 72 is applied and processed by photolithography to form a plurality of plug patterns 73a to 73d which are openings above the upper electrode 67 and a plug pattern 73e which is an opening above a plug pad region of the lower electrode 65.

Figure 24A:
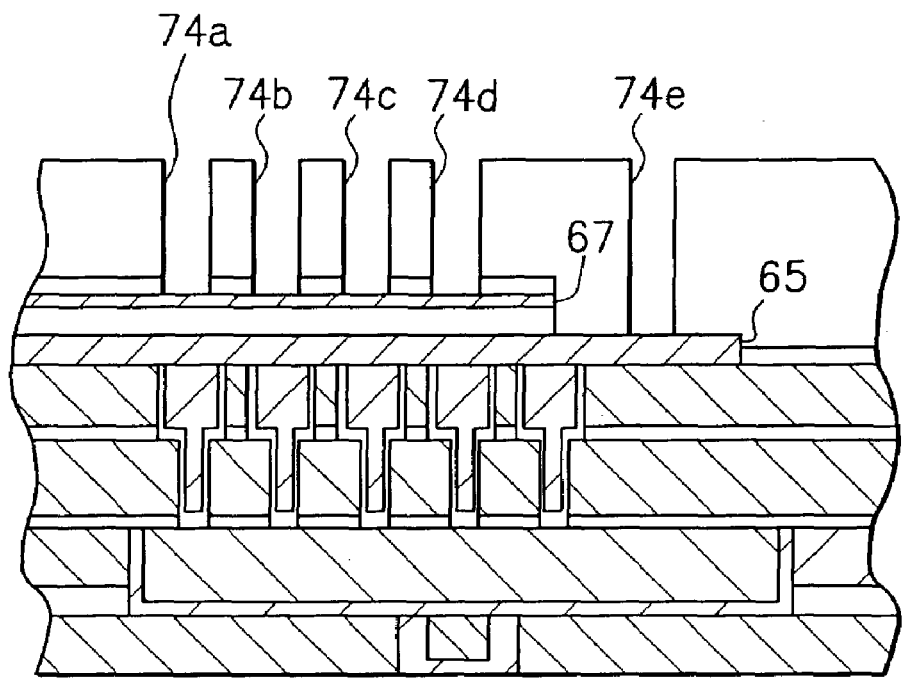
FIG. 24A and FIG. 24B are diagrammatic sectional views showing the semiconductor device manufacturing method according to the third embodiment in the order of its processes, subsequently to FIG. 23A and FIG. 23B.

Subsequently, as shown in FIG. 24A, via holes 74a to 74e are formed by reactive ion etching with the photo resist 72 used as a mask, and then the photo resist 72 is removed by ashing or the like.

Figure 24B:
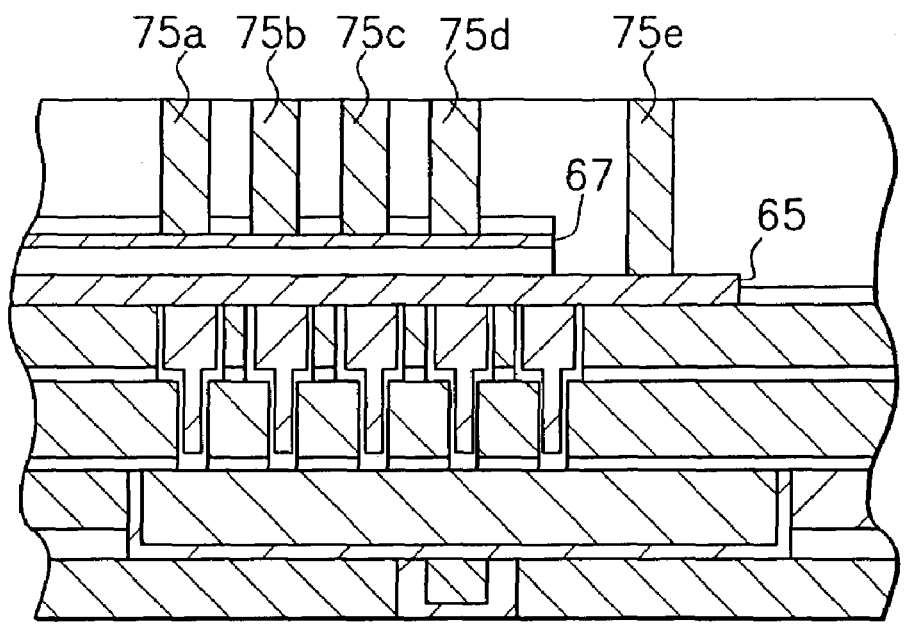

Subsequently, as shown in FIG. 24B, a metal such as tungsten is selectively grown in each of the via holes 74a to 74e, and the surface of the interlayer insulation film 71 is polished by a CMP method to be flattened. Thereby, plugs 75a to 75d of the upper electrode 67 and a plug 75e of the lower electrode 65 of the MIM capacitor are formed respectively.

Figure 25A:
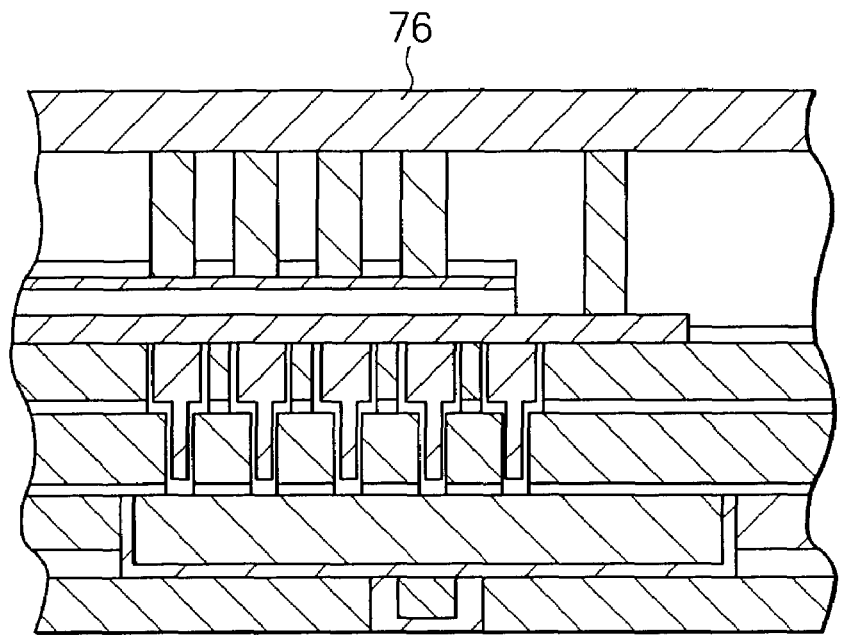
FIG. 25A and FIG. 25B are diagrammatic sectional views showing the semiconductor device manufacturing method according to the third embodiment in the order of its processes, subsequently to FIG. 24A and FIG. 24B.
Figure 25B:
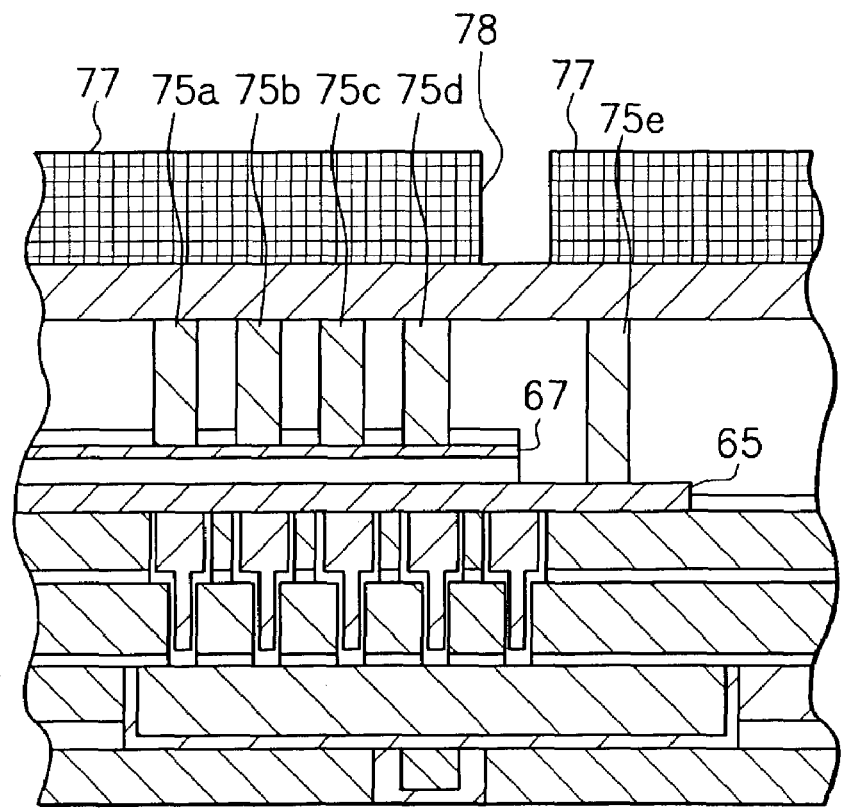

Subsequently, as shown in FIG. 25A, an aluminum film 76 is formed by depositing using a sputtering method. Next, as shown in FIG. 25B, a photo resist 77 is applied and processed by photolithography to form a separation pattern 78 which opens above a region between the plugs 75a to 75d of the upper electrode 67 and the plug 75e of the lower electrode 65.

Figure 26:
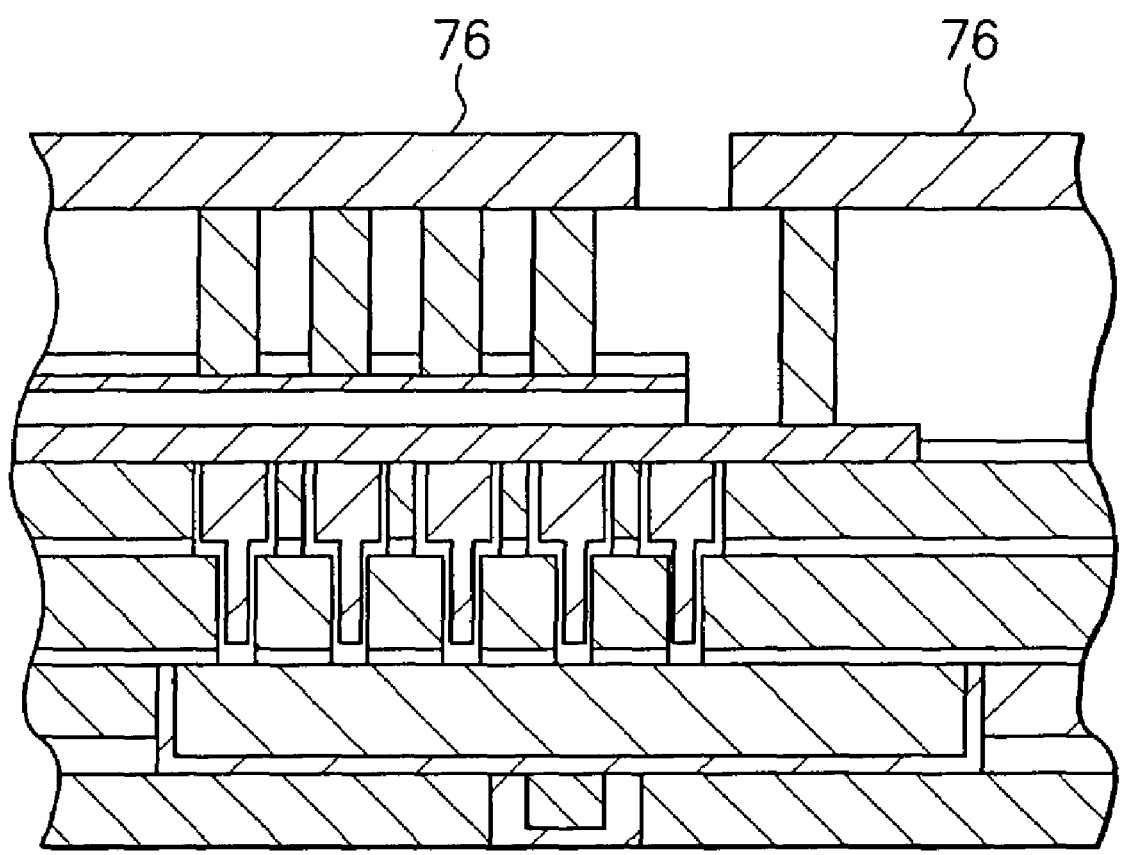
FIG. 26 is a diagrammatic sectional view showing the semiconductor device manufacturing method according to the third embodiment in the order of its processes, subsequently to FIG. 25A and FIG. 25B.

Subsequently, as shown in FIG. 26A, the aluminum film 76 is dry-etched according to the separation pattern 78 to form an aluminum wiring 76.

Thus, in this embodiment, flatness of the MIM capacitor is secured so that capacity precision can be maintained. In addition, the second Cu wiring is completely covered with the lower electrode and the silicon nitride film so that Cu diffusion to the interlayer insulation film can be prevented without fail.

Furthermore, this embodiment has such a configuration that a plurality of the second Cu wirings and plugs are connected to the lower electrode to increase a passage for supplying an electrical charge to the lower electrode. Consequently, the resistance of the passage for supplying the electrical charge to the lower electrode can further be lowered.

<Fourth Embodiment>

Next, a fourth embodiment of the present invention will be explained. Since manufacturing processes of a multilayered structure inclusive of Cu wirings of this embodiment are the same as those in FIG. 2A to FIG. 8B which are explained in the first embodiment, processes subsequent to them will be explained.

Figure 27A:
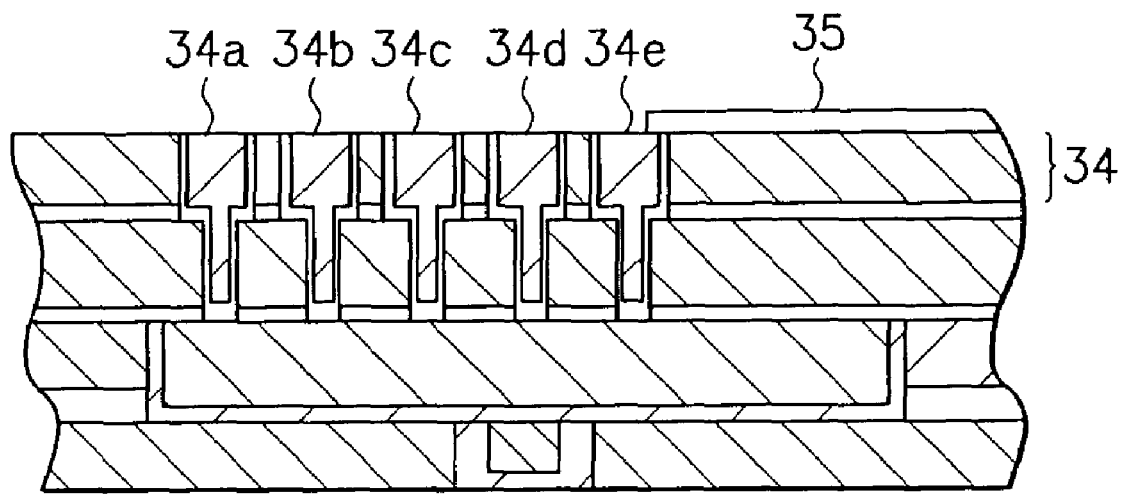
FIG. 27A and FIG. 27B are diagrammatic sectional views showing a semiconductor device manufacturing method according to a fourth embodiment of the present invention in the order of its processes.
Figure 27B:
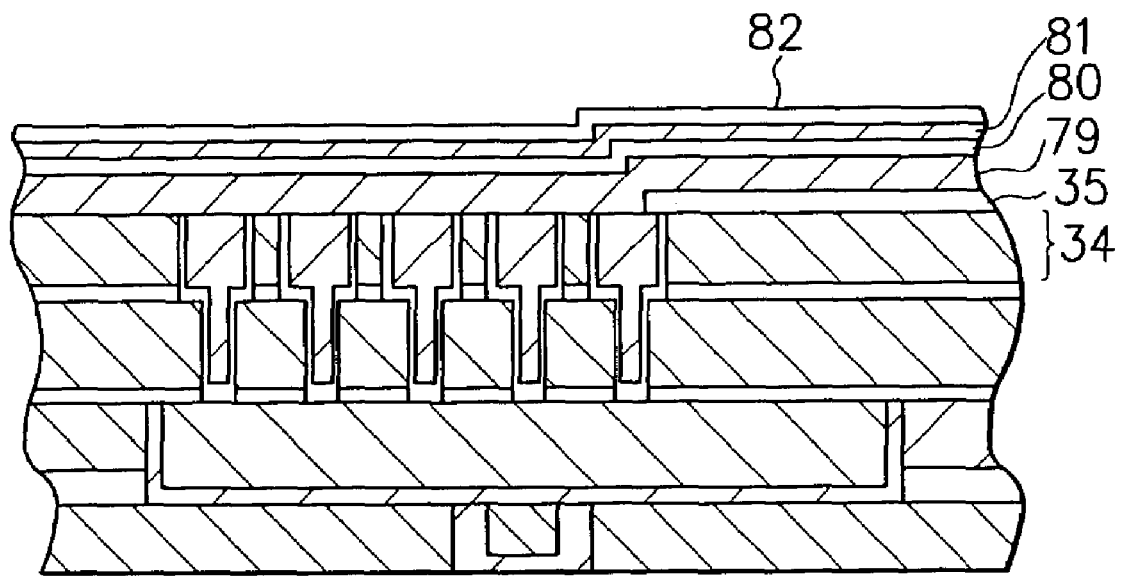

First, as shown in FIG. 27B, a nitride titanium film 79, a silicon oxide film 80, a nitride titanium film 81, and a silicon nitride film 82 are formed in sequence on a second Cu wiring layer 34 and a silicon nitride film 35. At this time, the nitride titanium film 79, the silicon oxide film 80, the nitride titanium film 81, and the silicon nitride film 82 are formed by depositing to be about 100 nm, about 40 nm, about 50 nm, and about 70 nm in film thickness respectively. Here, the nitride titanium films 79, 81 are formed by a sputtering method or the like and the silicon oxide film 80 and the silicon nitride film 82 are formed by a CVD method or the like.

Figure 28A:
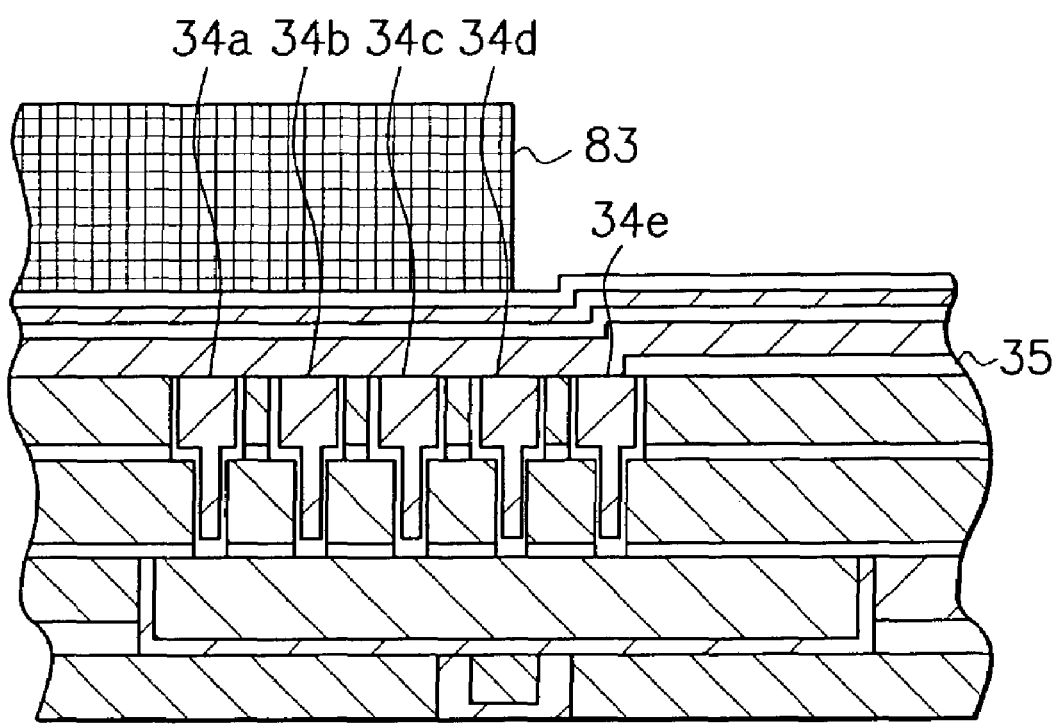
FIG. 28A and FIG. 28B are diagrammatic sectional views showing the semiconductor device manufacturing method according to the fourth embodiment in the order of its processes, subsequently to FIG. 27A and FIG. 27B.

Subsequently, as shown in FIG. 28A, in order to demarcate a region where an upper electrode of an MIM capacitor is to be formed, a photo resist 83 is applied and processed by photolithography.

Figure 28B:
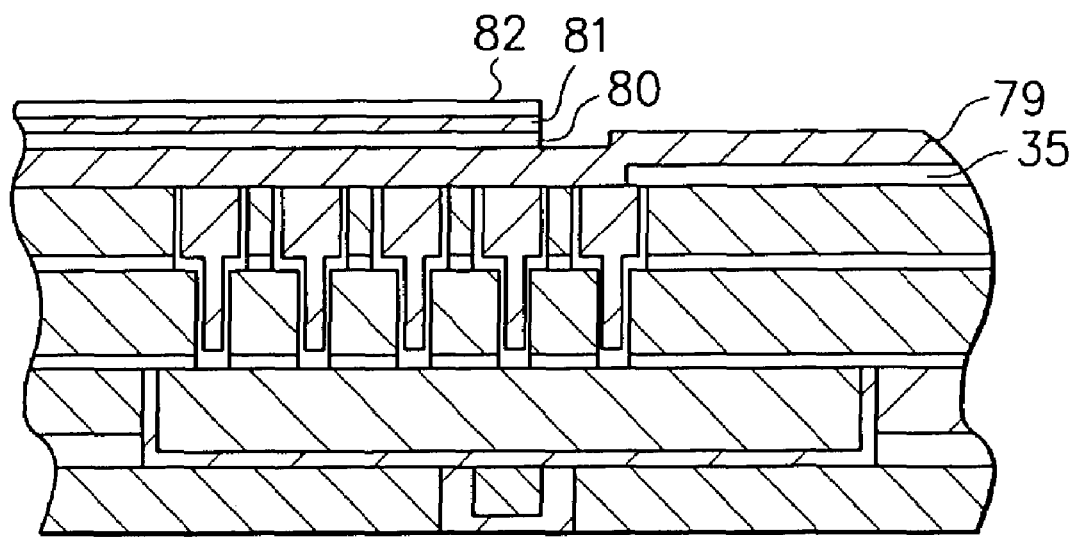

Subsequently, as shown in FIG. 28B, with the photo resist 83 used as a mask, the silicon nitride film 82, the nitride titanium film 81, and the silicon oxide film 80 are reactively ion-etched. Next, the photo resist 83 is removed by ashing or the like.

Figure 29A:
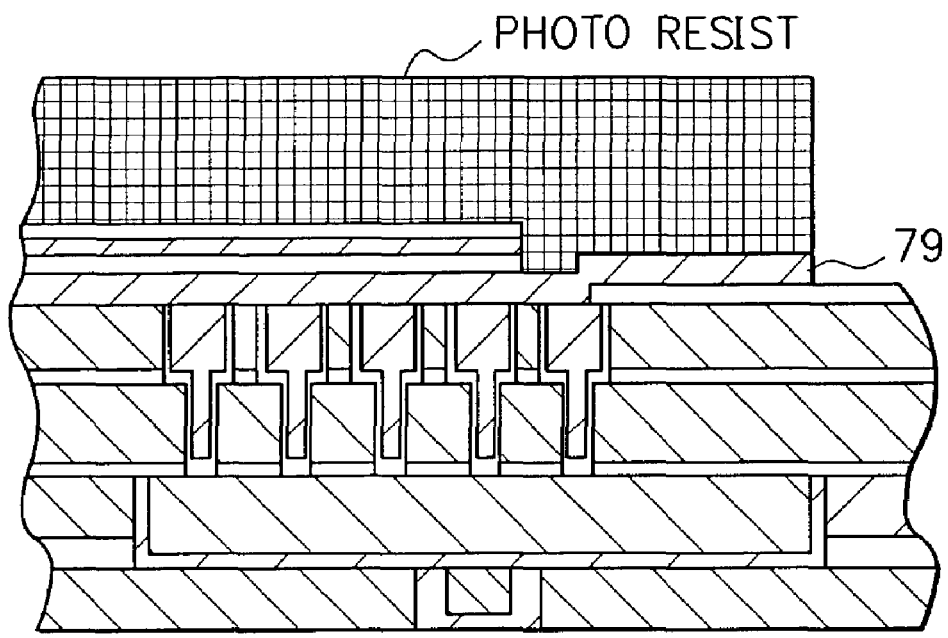
FIG. 29A and FIG. 29B are diagrammatic sectional views showing the semiconductor device manufacturing method according to the fourth embodiment in the order of its processes, subsequently to FIG. 28A and FIG. 28B.

Subsequently, as shown in FIG. 29A, in order to demarcate a region where a lower electrode of the MIM capacitor is to be formed, a photo resist is applied and processed by photolithography in such a manner that the photo resist is left above a region embracing second Cu wirings 34a to 34e. Then, with the photo resist used as a mask, the nitride titanium film 79 is reactively ion-etched and the photo resist is removed by ashing or the like. Thereby, the lower electrode 79 of the MIM capacitor is formed.

Figure 29B:
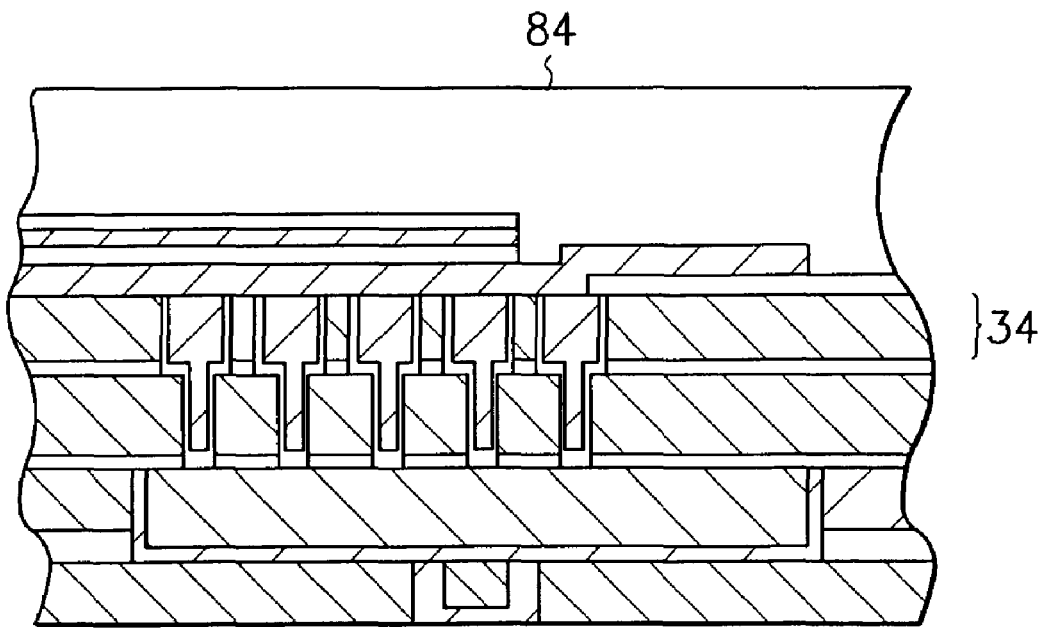

Subsequently, as shown in FIG. 29B, after an interlayer insulation film 84 is formed on the entire surface by a CVD method or the like to be about 1400 nm in film thickness, the surface is flattened by a CMP method until its film thickness becomes about 730 nm from the surface of the second Cu wiring layer 34.

Figure 30A:
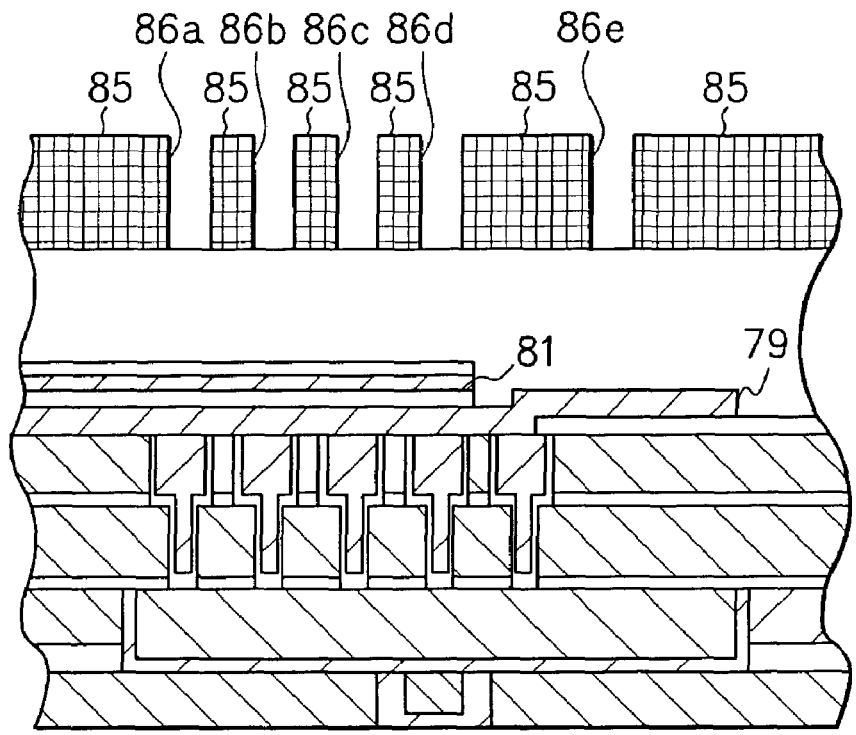
FIG. 30A and FIG. 30B are diagrammatic sectional views showing the semiconductor device manufacturing method according to the fourth embodiment in the order of its processes, subsequently to FIG. 29A and FIG. 29B.

Subsequently, as shown in FIG. 30A, a photo resist 85 is applied and processed by photolithography to form plug patterns 86a to 86d which are openings above the upper electrode 81 and a plug pattern 86e which is an opening above a leading pad region of the lower electrode 79.

Figure 30B:
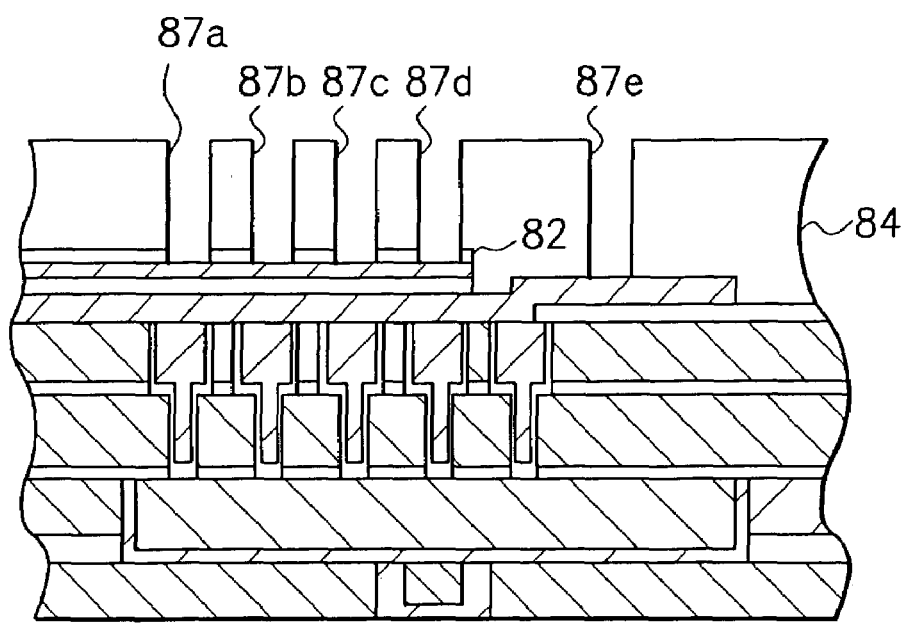

Subsequently, as shown in FIG. 30B, with the photo resist 85 used as a mask, via holes 87a to 87e are formed by reactive ion etching. At this time, the via holes 87a to 87d are formed by etching portions, corresponding to the plug patterns 86a to 86d, of the interlayer insulation film 84 and the silicon nitride film 82 while the via hole 87e is formed by etching a portion, corresponding to the plug pattern 86e, of the interlayer insulation film 84.

Figure 31A:
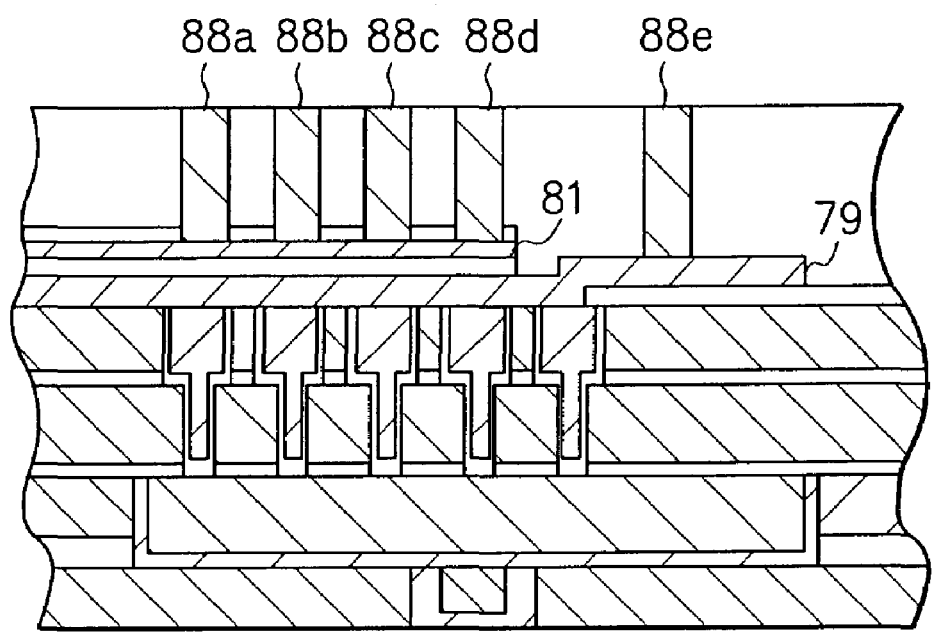
FIG. 31A and FIG. 31B are diagrammatic sectional views showing the semiconductor device manufacturing method according to the fourth embodiment in the order of its processes, subsequently to FIG. 30A and FIG. 30B.

Subsequently, as shown in FIG. 31A, a metal such as tungsten is selectively grown in each of the via holes 87a to 87e, and the surface of the interlayer insulation film 84 is polished by a CMP method to be flattened. Thereby, plugs 88a to 88d of the upper electrode 81 and a plug 88e of the lower electrode 79 of the MIM capacitor are formed respectively.

Figure 31B:
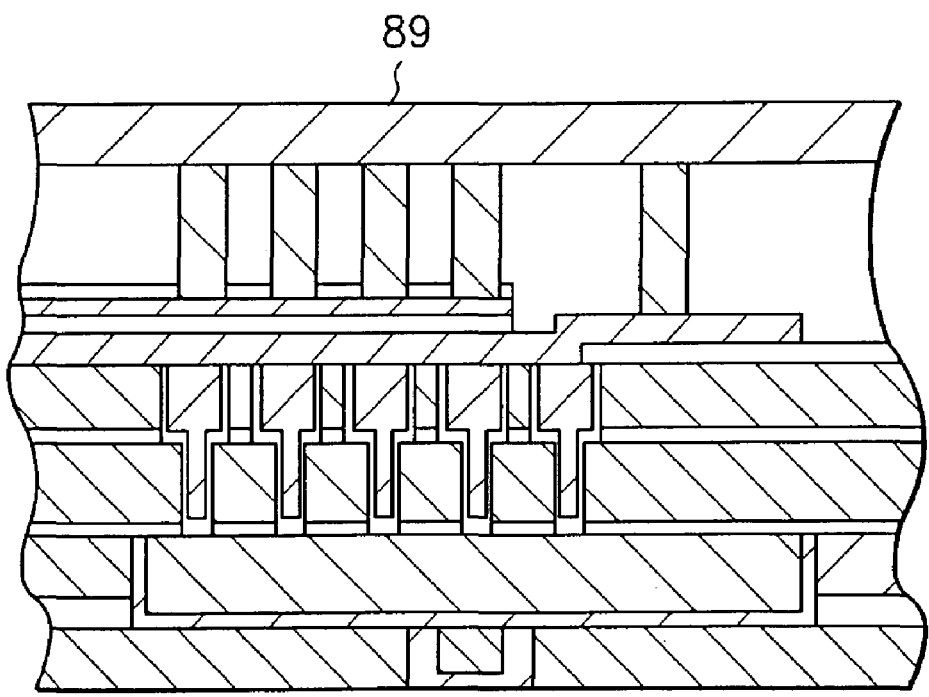

Subsequently, as shown in FIG. 31B, an aluminum film 89 is formed by depositing using a sputtering method or the like. Next, as shown in FIG. 32A, a photo resist 90 is applied and processed by photolithography to form a separation pattern 91 which opens above a region between the plug 88a to 88d of the upper electrode 81 and the plug 88e of the lower electrode 79.

Next, as shown in FIG. 32B, the aluminum film 89 is dry-etched according to the separation pattern 91 to form an aluminum wiring 89.

Thus, in the fourth embodiment of the present invention, the lower electrode is formed to completely cover the opening region of the silicon nitride film in order to eliminate the exposure of the second Cu wiring. This causes a step to occur in the lower electrode, but since its flatness is maintained in a portion corresponding to the actual capacity section of the MIM capacitor, capacity precision is not lowered.

Furthermore, this embodiment is so configured that a plurality of the second Cu wirings and plugs are connected to the lower electrode to increase a passage for supplying an electrical charge to the lower electrode. Thereby, the resistance of the passage for supplying the electrical charge to the lower electrode can be further lowered.

<Fifth Embodiment>

Next, a fifth embodiment of the present invention will be explained. Since manufacturing processes of a multilayered structure inclusive of Cu wirings of this embodiment are the same as those in FIG. 2A to FIG. 8B which are explained in the first embodiment, processes subsequent to them will be explained.

Figure 33A:
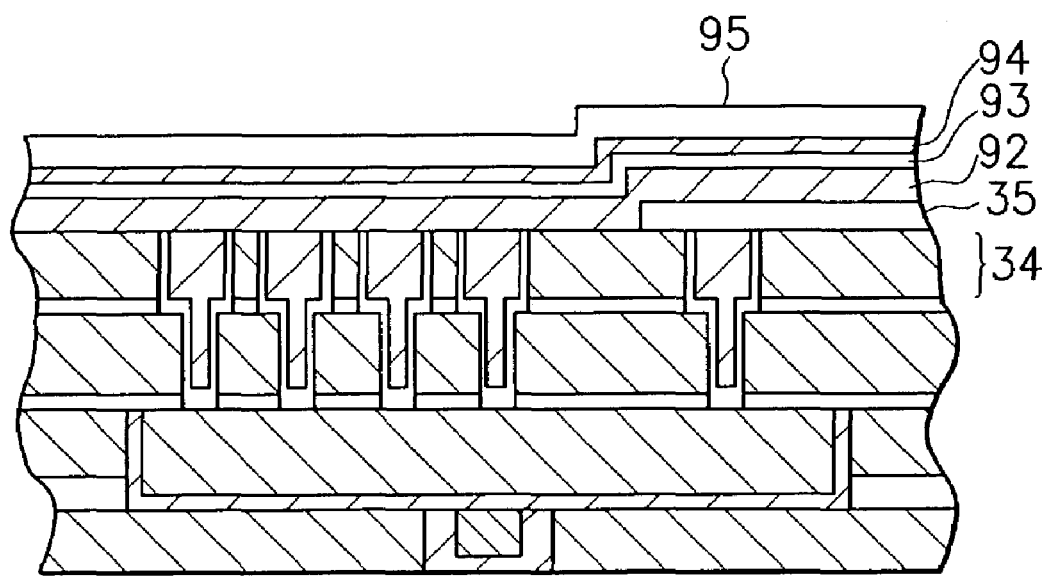
FIG. 33A and FIG. 33B are diagrammatic sectional views showing a semiconductor device manufacturing method according to a fifth embodiment of the present invention in the order of its processes.

First, as shown in FIG. 33A, a nitride titanium film 92, a silicon oxide film 93, a nitride titanium film 94, and a silicon nitride film 95 are formed in sequence on a second Cu wiring layer 34 and a silicon nitride film 35. At this time, the nitride titanium film 92, the silicon oxide film 93, the nitride titanium film 94, and the silicon nitride film 95 are formed by depositing to be about 100 nm, about 40 nm, about 50 nm, and about 70 nm in film thickness respectively. Here, the nitride titanium films 92, 94 are formed by a sputtering method or the like and the silicon oxide film 93 and the silicon nitride film 95 are formed by a CVD method or the like.

Figure 33B:
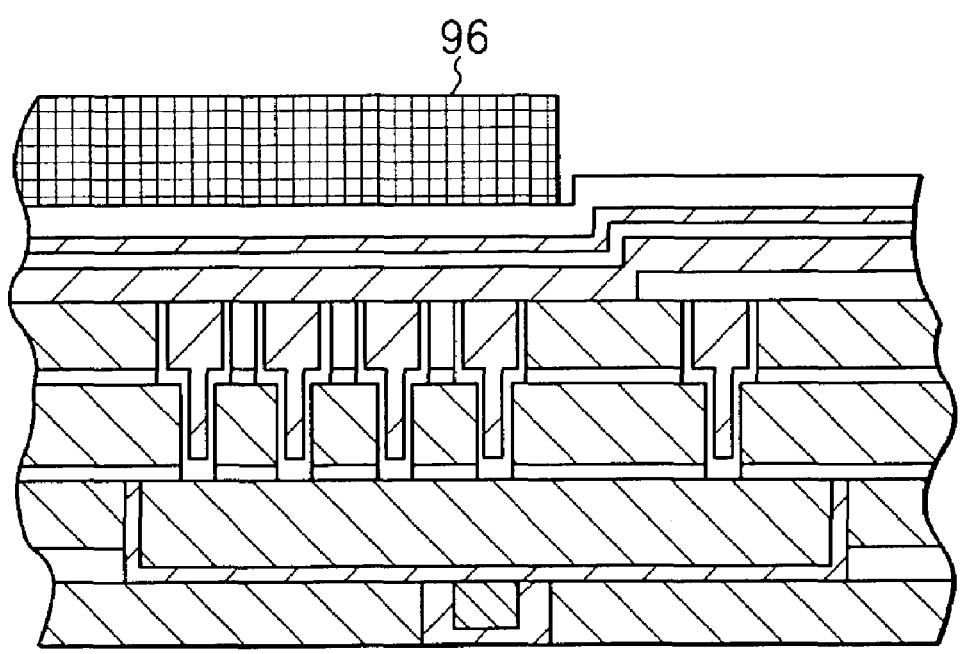

Subsequently, as shown in FIG. 33B, in order to demarcate a region where an MIM capacitor is to be formed, a photo resist 96 is applied and processed to a resist pattern in which the photo resist 96 is left above a region embracing second Cu wirings 34a to 34d.

Figure 34A:
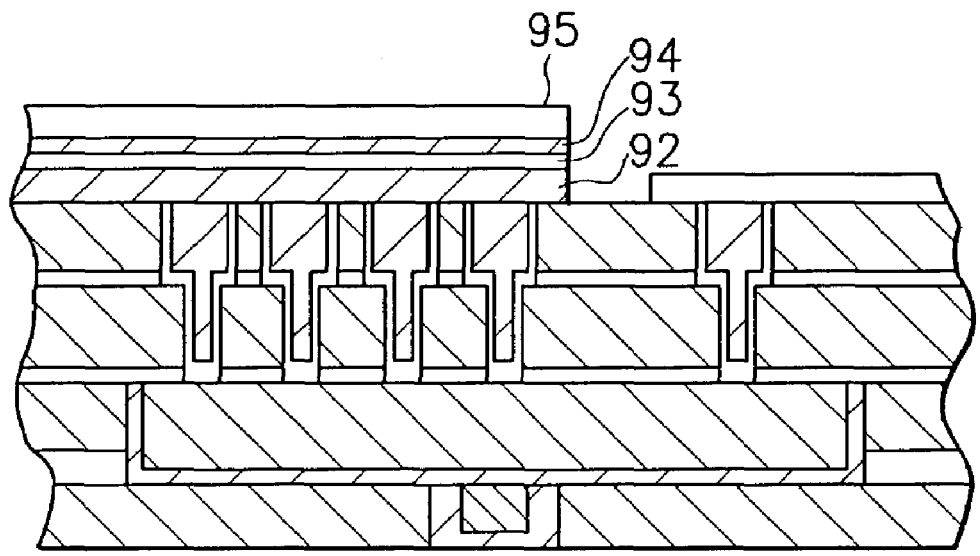
FIG. 34A and FIG. 34B are diagrammatic sectional views showing the semiconductor device manufacturing method according to the fifth embodiment in the order of its processes, subsequently to FIG. 33A and FIG. 33B.

Next, as shown in FIG. 34A, with the photo resist 96 used as a mask, the silicon nitride film 95, the nitride titanium film 94, the silicon oxide film 93, and the nitride titanium film 92 are reactively ion-etched, and the photo resist 96 is removed by ashing or the like.

Figure 34B:
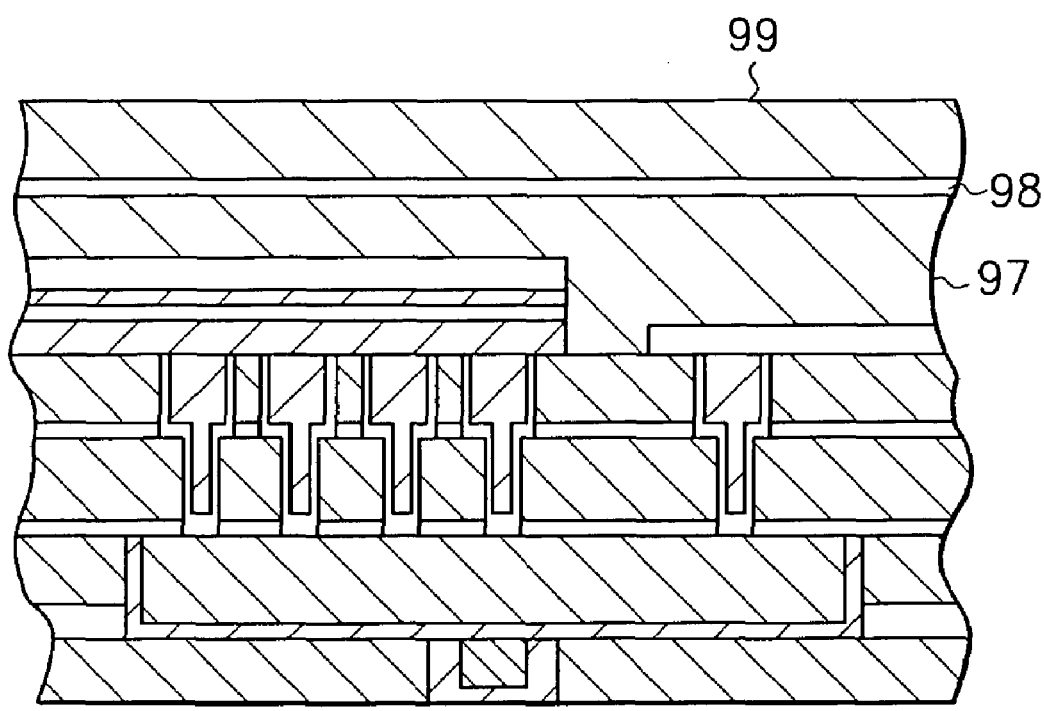

Subsequently, as shown in FIG. 34B, an interlayer insulation film 97 comprised of oxide silicon, a silicon nitride film 98, and an interlayer insulation film 99 also comprised of oxide silicon are formed in sequence by a CVD method or the like.

Figure 35A:
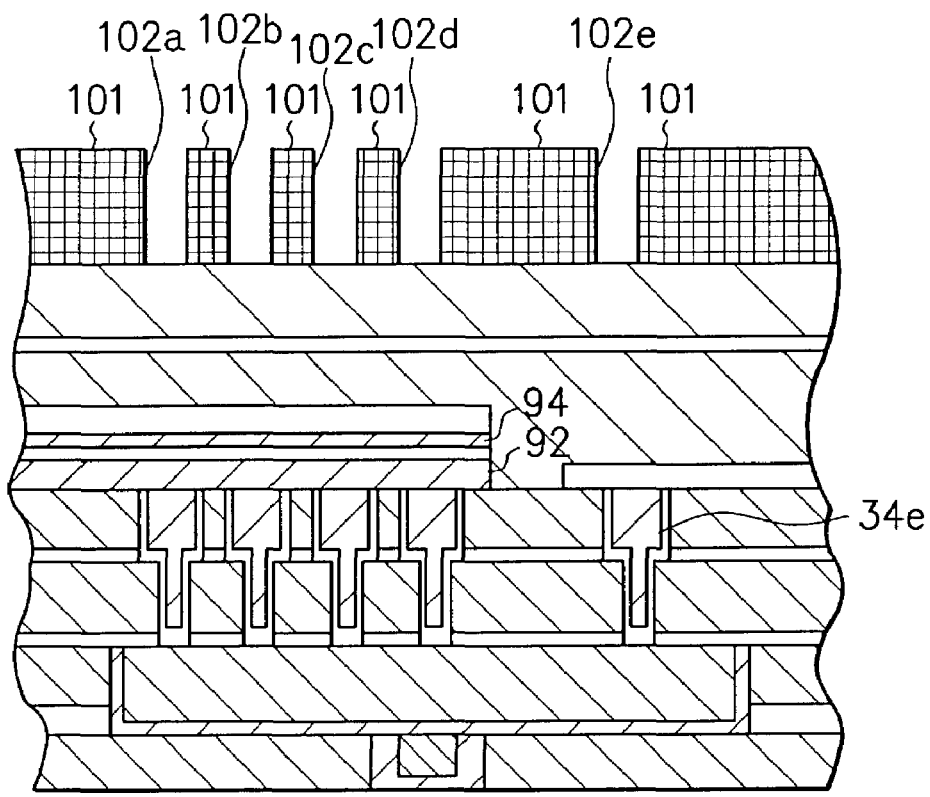
FIG. 35A and FIG. 35B are diagrammatic sectional views showing the semiconductor device manufacturing method according to the fifth embodiment in the order of its processes, subsequently to FIG. 34A and FIG. 34B.

Subsequently, as shown in FIG. 35A, a photo resist 101 is applied, and aperture patterns 102a to 102d of an upper electrode 94 which are openings above the MIM capacitor and an aperture pattern 102e of a lower electrode 92 which is an opening above a second Cu wiring 34e are formed by photolithography.

Figure 35B:
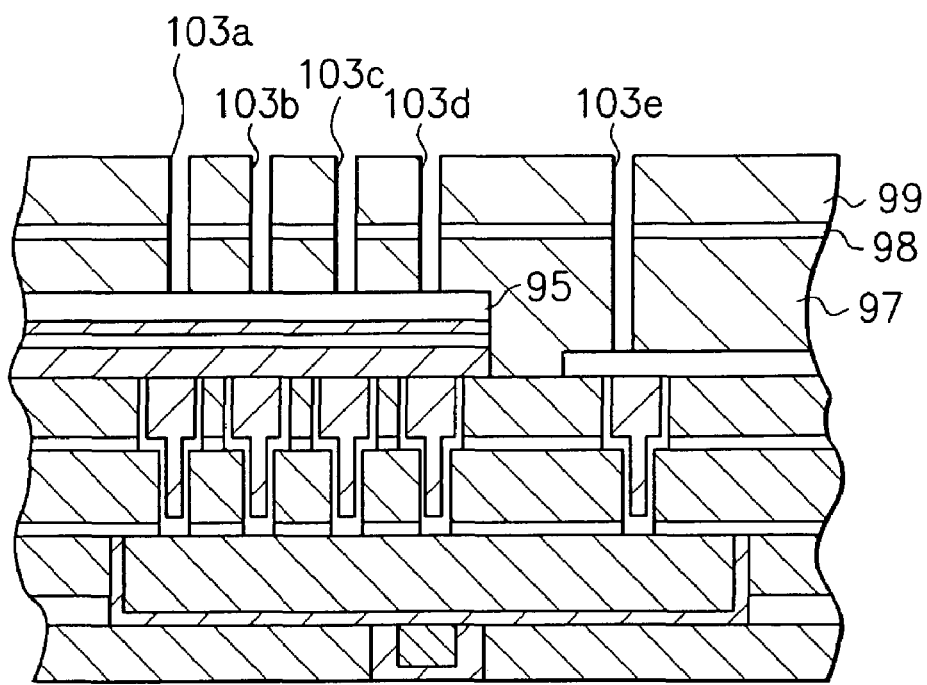

Subsequently, as shown in FIG. 35B, with the photo resist 101 used as a mask, via holes 103a to 103e are formed by reactive ion etching, and the photo resist 101 is removed by ashing or the like.

Figure 36A:
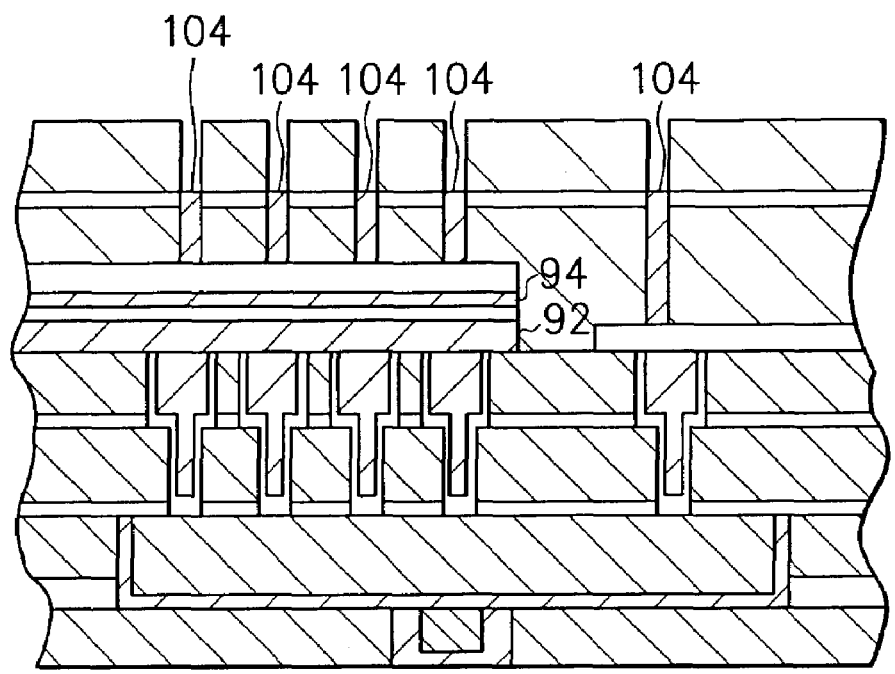
FIG. 36A and FIG. 36B are diagrammatic sectional views showing the semiconductor device manufacturing method according to the fifth embodiment in the order of its processes, subsequently to FIG. 35A and FIG. 35B.

Subsequently, as shown in FIG. 36A, a protective material 104 comprised of resist or the like is filled in a lower portion of each of the via holes 103a to 103e.

Figure 36B:
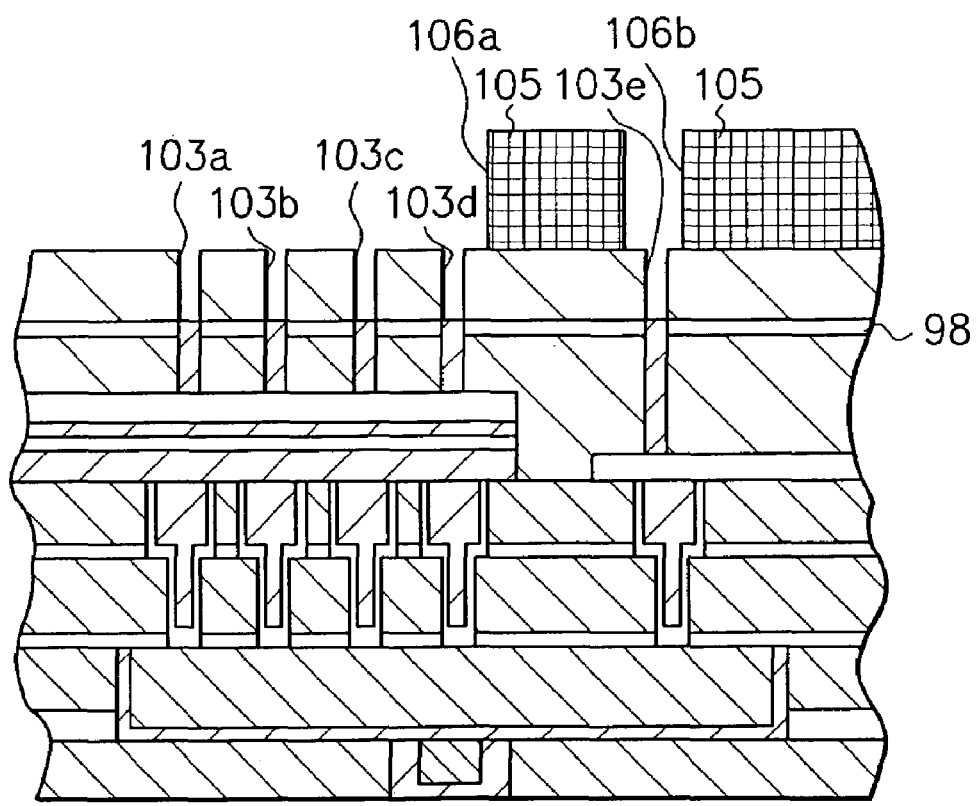

Subsequently, as shown in FIG. 36B, a photo resist 105 is applied, and an aperture pattern 106a which is an opening above the via holes 103a to 103d for plug of the upper electrode 94 and an aperture pattern 106b which is an opening above the via hole 103e for plug of the lower electrode 92 are formed by photolithography.

Figure 37A:
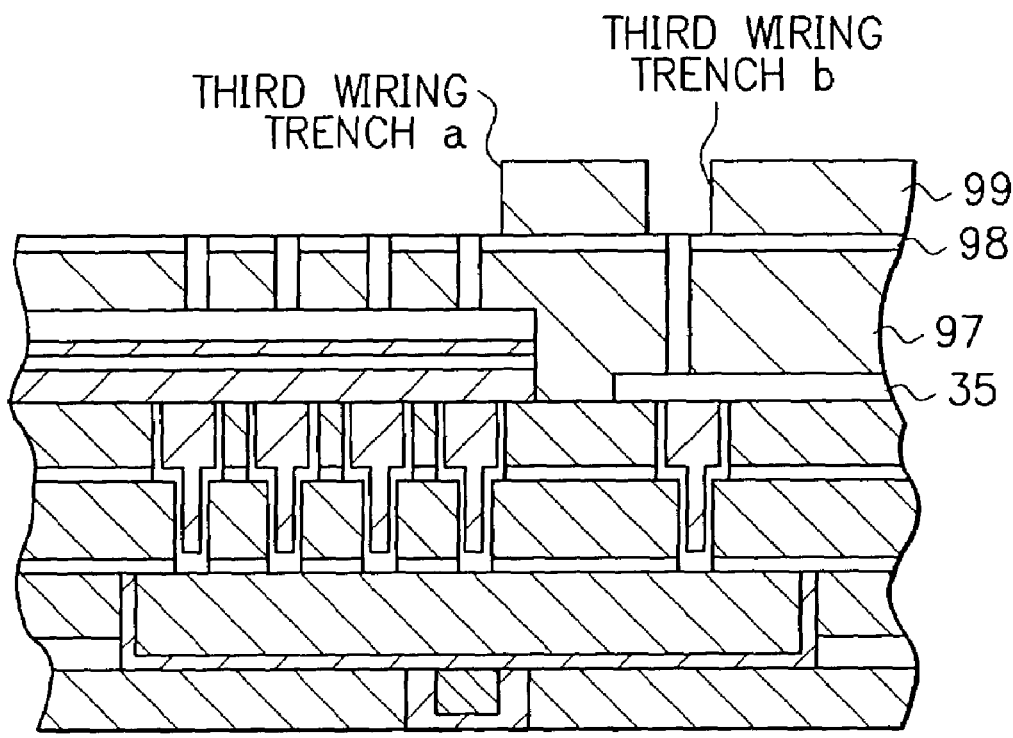
FIG. 37A and FIG. 37B are diagrammatic sectional views showing the semiconductor device manufacturing method according to the fifth embodiment in the order of its processes, subsequently to FIG. 36A and FIG. 36B.

Subsequently, as shown in FIG. 37A, with the photo resist 105 used as a mask and with the silicon nitride film 98 used as an etching stopper, the interlayer insulation film 99 is dry-etched to form third wiring trenches a, b, and thereafter, the photo resist 105 and the protective material 104 are removed by ashing or the like.

Figure 37B:
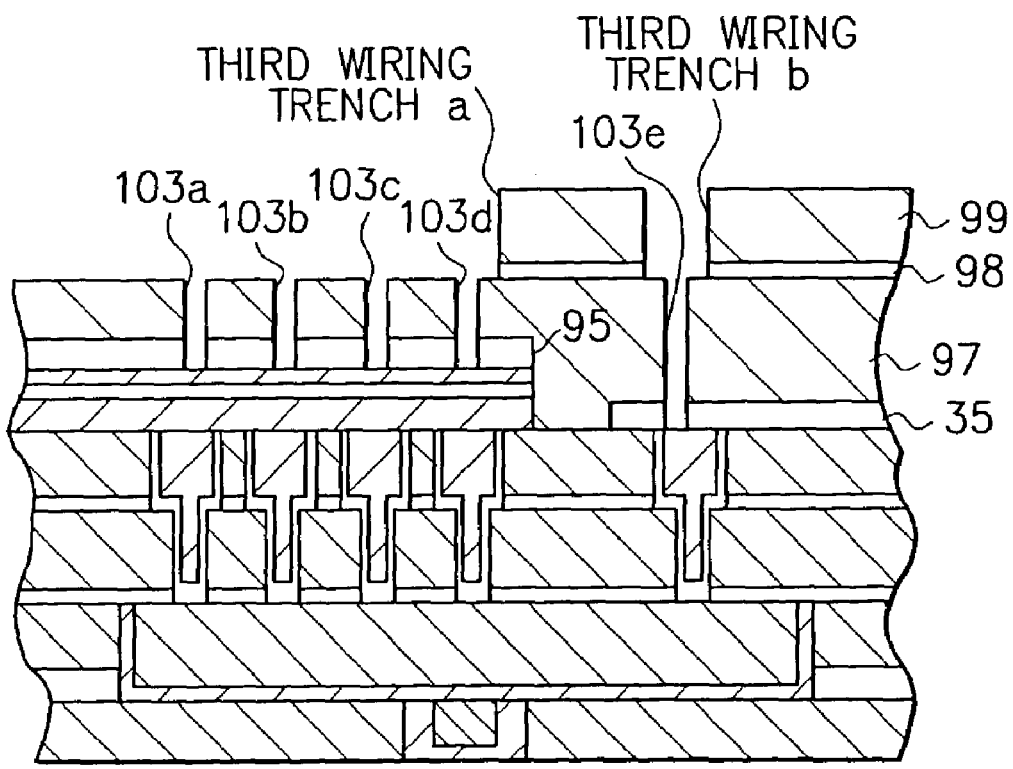

Subsequently, as shown in FIG. 37B, the residual silicon nitride films 95, 35 in bottom portions of the via holes 103a to 103e and the residual silicon nitride film 98 in bottom portions of the wiring trenches a, b are removed by whole-surface dry etching. Thereby, the third wiring trench a and the via holes 103a to 103d are integrated and the third wiring trench b and the via hole 103e are integrated.

Figure 38A:
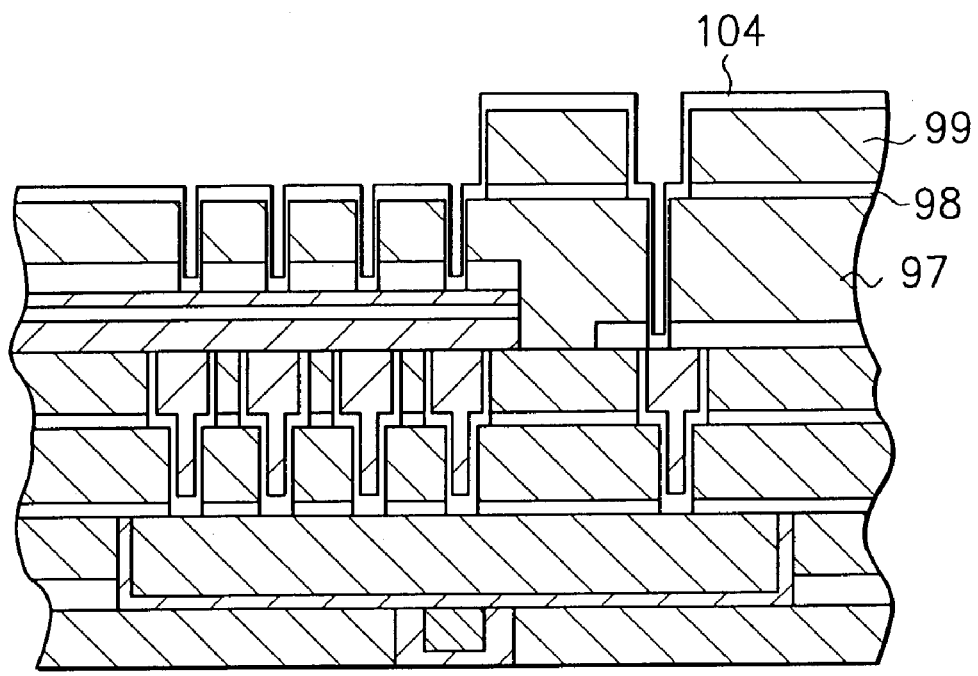
FIG. 38A and FIG. 38B are diagrammatic sectional views showing the semiconductor device manufacturing method according to the fifth embodiment in the order of its processes, subsequently to FIG. 37A and FIG. 37B.
Figure 38B:
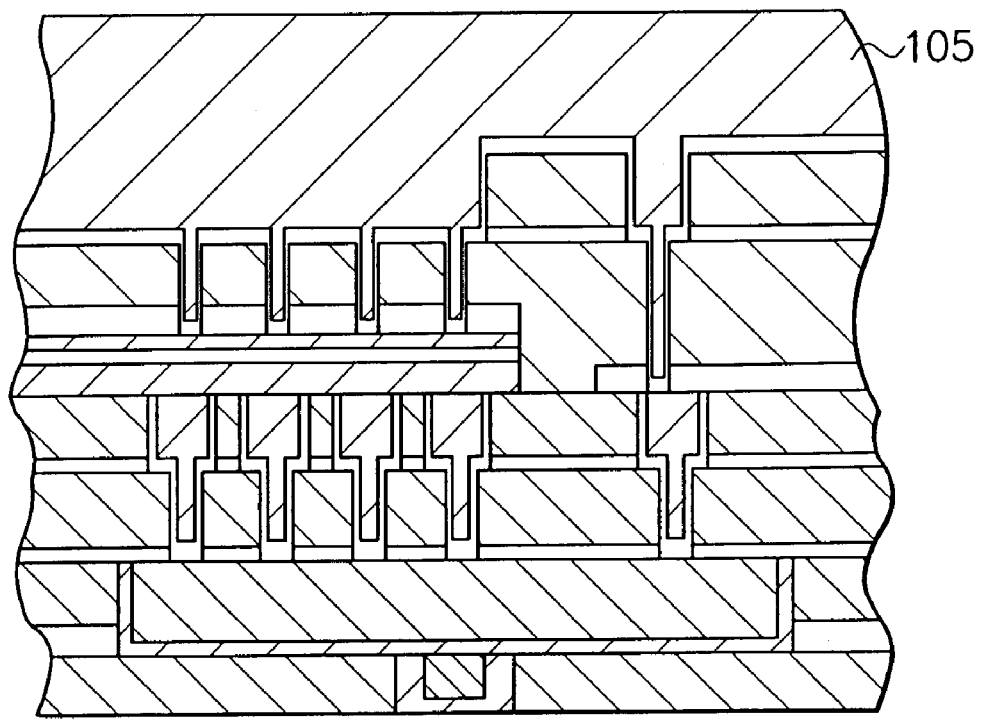

Subsequently as shown in FIG. 38A, a barrier metal film 104 comprised of TaN and a Cu film (not shown) as a seed metal film are successively formed in vacuum in sequence by a sputtering unit. Next, as shown in FIG. 38B, with the barrier metal film 104 serving as an electrode, a Cu film 105 is formed by a plating method to fill the third wiring trenches a, b and the via holes 103a to 103e.

Figure 39:
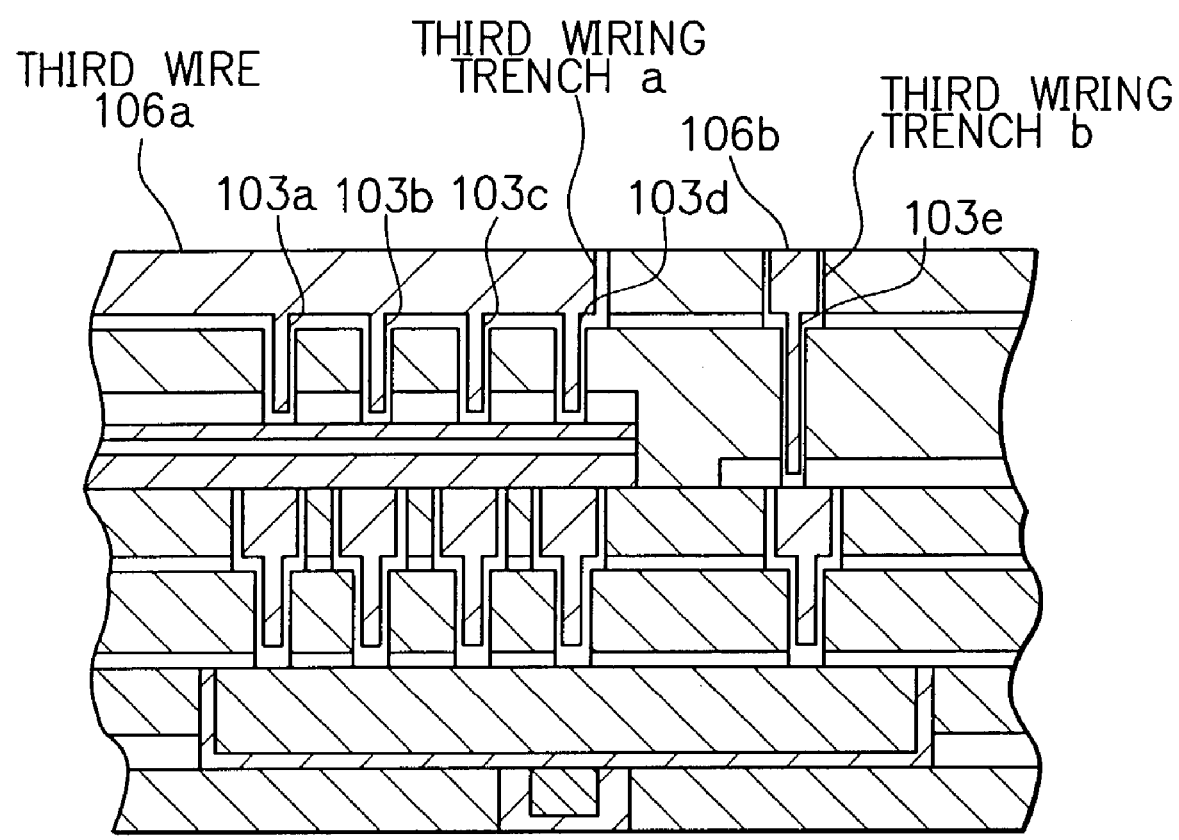
FIG. 39 is a diagrammatic sectional view showing the semiconductor device manufacturing method according to the fifth embodiment in the order of its processes, subsequently to FIG. 38A and FIG. 38B.

Subsequently, as shown in FIG. 39, in order to separate the Cu film by a damascene method, the Cu film 105 is polished by a CMP method and washed by wetting, with the Cu film 105 in the wiring trenches a, b and the via holes 103a to 103e being left, to form third Cu wirings 106a, 106b.

In this way, in the fifth embodiment of the present invention, flatness of the MIM capacitor is secured so that capacity precision can be maintained. At the same time, since the second Cu wiring is completely covered with the lower electrode and the silicon nitride film, Cu diffusion to the interlayer insulation film can be prevented without fail.

Furthermore, this embodiment is so configured that a plurality of the second Cu wirings are connected to the lower electrode to increase a passage for supplying an electrical charge to the lower electrode. In addition, plugs of the upper electrode and the lower electrode and an upper wiring are comprised of the Cu layers whose resistances are low. Consequently, the resistance of the passage for supplying the electrical charge to the upper electrode and the lower electrode can be further lowered so that a Q value can be further improved.

As is seen from the explanation hitherto, according to the present invention, a lower electrode comprised of a material preventive of the diffusion of a wiring material is used and the lower electrode and an upper surface of the wiring are connected in such a manner that the lower electrode embraces the wiring. Thereby, in a case when a wiring, for example, a Cu wiring comprised of a material which may possibly cause Cu diffusion is connected to the lower electrode of a capacitor, degradation of reliability of a function of the wiring due to the Cu diffusion and so on can be prevented since an upper surface of the Cu wiring is covered with the lower electrode which has a barrier metal function.

The present embodiments are to be considered in all respects as illustrative and no restrictive, and all changes which come within the meaning and range of equivalency of the claims are therefore intended to be embraced therein. The invention may be embodied in other specific forms without departing from the sprit or essential characteristics thereof.

What is claimed is:

1. A semiconductor device, comprising:
   a capacitor formed by capacity coupling of a lower electrode and an upper electrode,
   a plurality of first wirings having an upper surface completely covered with said lower electrode the first wirings being connected to said lower electrode respectively;
   a second wiring provided below said plurality of first wirings and connected to said plurality of first wirings;
   wherein the lower electrode is comprised of a material which would prevent diffusion of a material of said plurality of first wirings; and
   wherein said plurality of first wirings are in direct contact with the lower electrode.

2. The semiconductor device according to claim 1, wherein the lower electrode is connected to an upper third wiring provided above said capacitor.

3. The semiconductor device according to claim 2, wherein the lower electrode includes an extended region connected to the upper third wiring.

4. The semiconductor device according to claim 3, wherein the extended region overlaps a peripheral portion of a diffusion preventive film having an opening region in which said capacitor is formed.

5. The semiconductor device according to claim 2, wherein the upper third wiring is comprised of copper.

6. The semiconductor device according to claim 1, wherein said second wiring is comprised of copper.

7. The semiconductor device according to claim 1, further comprising: an etching stopper film formed on the upper electrode, said etching stopper film having an etching rate lower than at least that of an interlayer insulation film covering said capacitor.

8. The semiconductor device of claim 1, wherein said plurality of first wirings being perpendicular to each other.

9. The semiconductor device of claim 1, wherein each of said plurality of first wirings has a surface flattened by a CMP process.

* * * * *